(12) United States Patent
Zong

(10) Patent No.: US 11,389,825 B2
(45) Date of Patent: Jul. 19, 2022

(54) METHODS FOR PREPARING NANO-PROTECTIVE COATING WITH A MODULATION STRUCTURE

(71) Applicant: Jiangsu Favored Nanotechnology Co., LTD, Wuxi (CN)

(72) Inventor: Jian Zong, Irvine, CA (US)

(73) Assignee: Jiangsu Favored Nanotechnology Co., LTD, Wuxi (CN)

( * ) Notice: Subject to any disclaimer, the term of this patent is extended or adjusted under 35 U.S.C. 154(b) by 7 days.

(21) Appl. No.: 16/798,131

(22) Filed: Feb. 21, 2020

(65) Prior Publication Data

US 2020/0188954 A1 Jun. 18, 2020

Related U.S. Application Data

(63) Continuation-in-part of application No. PCT/CN2018/082839, filed on Apr. 12, 2018, and a
(Continued)

(30) Foreign Application Priority Data

Aug. 23, 2017 (CN) .......................... 201710729416.0
Aug. 23, 2017 (CN) .......................... 201710729732.8
Aug. 23, 2017 (CN) .......................... 201710729755.9

(51) Int. Cl.
  *B05D 1/00* (2006.01)
(52) U.S. Cl.
  CPC ................. *B05D 1/62* (2013.01); *B05D 1/60* (2013.01); *B05D 2201/02* (2013.01); *B05D 2202/10* (2013.01); *B05D 2518/12* (2013.01)
(58) Field of Classification Search
  None
  See application file for complete search history.

(56) References Cited

U.S. PATENT DOCUMENTS 4,824,753 A * 4/1989 Hotomi ................ G03G 9/1131
  430/111.35
5,364,666 A * 11/1994 Williams .............. A61L 31/084
  427/255.37
(Continued)

FOREIGN PATENT DOCUMENTS

CN     1125267 A    6/1996
CN   101678642 A    3/2010
(Continued)

OTHER PUBLICATIONS

Chen, Jierong , "Low Temperature Plasma Chemistry and its Application", Jul. 31, 2001 (Jul. 31, 2001), p. 150, the fourth paragraph from the bottom to the second paragraph from the bottom, non-official translation (Surface Hardening Film Application.), Jul. 31, 2001, pp. 150.
(Continued)

*Primary Examiner* — Shamim Ahmed
*Assistant Examiner* — Bradford M Gates
(74) *Attorney, Agent, or Firm* — Perkins Coie LLP

(57) ABSTRACT

Methods and associated systems for preparing a nano-protective coating are disclosed. The method includes (1) placing a substrate in a reaction chamber of a nano-coating preparation equipment; (2) introducing an inert gas, wherein the inert gas includes helium (He) and/or argon (Ar); (3) turning on a movement mechanism so that the substrate is moved in the reaction chamber; (4) introducing a first monomer vapor into the reaction chamber to achieve a vacuum degree of 30-300 mTorr; (5) turning on a plasma discharge for chemical vapor deposition; and (6) introducing a second monomer vapor into the reaction chamber to form an organosilicon nano-coating on a surface of the substrate.

27 Claims, 1 Drawing Sheet

Related U.S. Application Data continuation-in-part of application No. PCT/CN2018/082837, filed on Apr. 12, 2018, and a continuation-in-part of application No. PCT/CN2018/082834, filed on Apr. 12, 2018.

(56) References Cited

U.S. PATENT DOCUMENTS

| | | | | |
|---|---|---|---|---|
| 2013/0040102 | A1* | 2/2013 | Gleason | B05D 1/62 428/141 |
| 2015/0247241 | A1* | 9/2015 | Ezure | C23C 16/40 428/446 |

FOREIGN PATENT DOCUMENTS

| | | |
|---|---|---|
| CN | 105296965 A | 2/2016 |
| CN | 106906456 A | 6/2017 |
| CN | 106916331 A | 7/2017 |
| CN | 106958012 A | 7/2017 |
| CN | 107058979 A | 8/2017 |
| CN | 107058980 A | 8/2017 |
| CN | 107523808 A | 12/2017 |
| CN | 107523809 A | 12/2017 |
| CN | 107587119 A | 1/2018 |
| CN | 107587120 A | 1/2018 |
| CN | 107686986 A | 2/2018 |
| CN | 107699868 A | 2/2018 |

OTHER PUBLICATIONS

Ye, Danqin, et al., "Preparation of Performance of Multilayer Films by RF Plasm Polymerization", Aug. 31, 2008 (Aug. 31, 2008), No. 4, ISSN: 1673-095X, p. 4, part 3, conclusion, Journal of Tianjin University of Technology), Aug. 31, 2008, pp. 4.

International Search Report dated Jun. 27, 2018 cited in PCT/CN2018/082834.

International Search Report dated Jul. 2, 2018 cited in PCT/CN2018/082837.

International Search Report dated Jun. 27, 2018 cited in PCT/CN2018/082839.

* cited by examiner

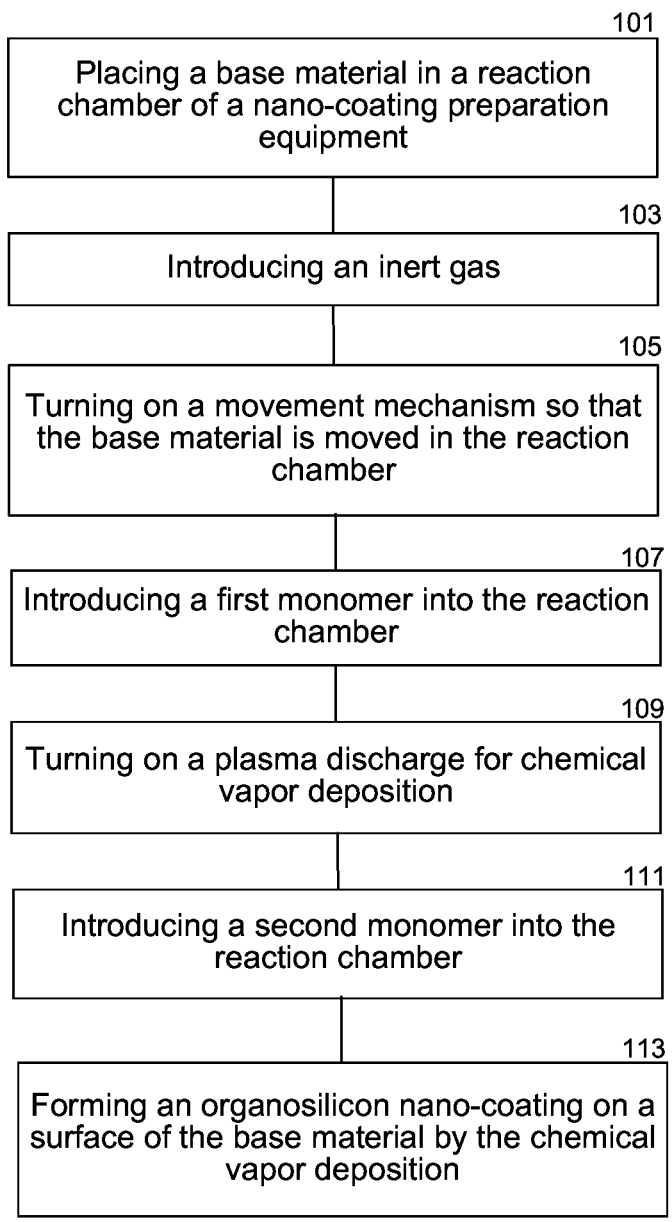

METHODS FOR PREPARING NANO-PROTECTIVE COATING WITH A MODULATION STRUCTURE

CROSS-REFERENCE TO RELATED APPLICATIONS

This application is a continuation-in-part of PCT Application Nos. PCT/CN2018/082834 filed on Apr. 12, 2018, which claims priority to Chinese Application No. 201710729755.9 filed Aug. 23, 2017; PCT/CN2018/082837 filed Apr. 12, 2018, which claims priority to Chinese Application No. 201710729732.8 filed Aug. 23, 2017; and PCT/CN2018/082839 filed Apr. 12, 2018, which claims priority to Chinese Application No. 201710729416.0 filed Aug. 23, 2017. The aforementioned applications are incorporated herein by reference in their entirety.

TECHNICAL FIELD

The present invention is directed to plasma chemical vapor deposition technology. More particularly, the present invention relates to a method for generating a nano-protective coating, such as an organosilicon nano-protective coating that can be formed by two or more groups of monomers. By this arrangement, the organosilicon nano-protective coating can have a modulation structure.

BACKGROUND

Mold-proof, moisture-proof, and salt spray proof (referred to as "three-proof") are important abilities that need to be addressed for electronic devices during storage, transportation, and use. Mold, salt spray and moisture often cause electronic devices to fail due to short circuit.

At present, the application of protective coatings to protect electronic products is an effective method to increase the service life of electronic products. There are usually two methods for obtaining protective coatings, namely liquid phase method and gas phase method. The liquid phase method usually uses a three-proof paint. After electronic products are coated, thermal curing or light curing is used to form a dense organic coating on the circuit board, which is used to protect the circuit board and related equipment from environmental erosion. The "three-proof" paint has good high and low temperature resistance properties. After curing, it forms a transparent protective film, which has superior insulation, moisture resistance, leakage resistance, shock resistance, dust resistance, corrosion resistance, aging resistance, and corona resistance, etc. However, the liquid phase method will produce waste water, waste gas and waste liquid. The solvent used will cause damage to the electronic device substrate itself. In addition, its thickness is mostly tens of microns and is difficult to be controlled to nano level, which will have some impact on the functions of some electronics that need heat dissipation and signal transmission.

Gas phase method includes evaporation and plasma vapor deposition and so on. The most typical evaporated coating is parylene coating, developed by the United States Union Carbide Co. and widely used in the protection of electronic products. Parylene coating is a polymer of p-xylene. P-xylene is first heated to 680 degrees Celsius to form an active p-xylene dimer. After the temperature in the deposition chamber is reduced, this dimer is deposited on the surface of the electronic product to form a polymer film. Due to the highly symmetrical structure of p-xylene, the dipole moment is 0, and due to the presence of benzene rings, the polymer molecules have a large free volume; and at the same time, the polymer has a relatively large molecular weight, which makes the coating dense. In light of the above characteristics, parylene coating is featured in low water, gas permeability and high barrier effect and can achieve the effect of resistance to moisture, water, rust, acid, and alkali corrosion. Such poly-p-xylene is produced by deposition in a vacuum state and can be applied to areas that cannot be covered by liquid coatings, such as the protection of high-frequency circuits and extremely weak current systems. Polymer film coating thickness is the main reason that affects the protective failure of poly-p-xylene vapor deposition conformal coating. The printed circuit board part polymer film coating is prone to local rust failure at a thickness of 3 to 7 microns, and the coating thickness should be ≥30 microns in case of not affecting high-frequency dielectric loss. Parylene coating has high requirements for the pretreatment of printed circuit boards that need protection, such as conductive components, signal transmission components, radio frequency components, etc., and shielding pretreatment is needed for circuit board components during vapor deposition conformal coating to avoid impact on component performance. This disadvantage has greatly limited the application of parylene coatings. Parylene coatings are featured in high raw material cost, harsh preparation conditions (high temperature and high vacuum requirements) and low film formation rate, and thick coatings are likely to cause poor heat dissipation, signal blocking and increased coating defects. In addition, in this method, only a few kinds of reactant monomers can be selected, such as p-xylene and p-xylene chloride, and the coating structure and function are poorly controllable. Due to the above reasons, it is difficult to widely apply parylene coatings.

In view of the above problems, it is of great application value to develop a coating that is environmentally friendly and insulative and has excellent protective properties when the coating is thin and a preparation method thereof.

Plasma chemical vapor deposition (PCVD) is a technology that uses plasma to activate a reactive gas to promote a chemical reaction on the surface of a base material (e.g., a substrate) or in a near-surface space to generate a solid film. Plasma chemical vapor deposition coating has the following advantages:

(1) It is a dry process, resulting in a uniform thin film with no pinholes.

(2) The plasma polymer film has stable chemical and physical properties such as solvent resistance, chemical resistance, heat resistance, abrasion resistance, etc.

(3) Plasma polymer film has a good adhesion to substrates.

(4) Uniform films can also be made on extremely irregular substrate surfaces.

(5) The temperature for coating preparation is low and it can be carried out at a normal temperature, which effectively avoids damages to temperature sensitive devices.

(6) Plasma process can not only prepare coatings with micron thickness but also prepare ultra-thin nano-coatings.

(7) The design of the coating is strong. Under plasma conditions, most organic monomers can be activated into free radicals with relatively high activity and form a coating on the surface of electronic products. The screening and design of monomer dipole moment, chemical inertia and free volume are important strategies to obtain coatings with good insulation and excellent protective performance in case of thin coating.

(8) The coating structure is highly controllable, and the composition and proportion of the monomer can be changed at any time, so that the coating has a special structure such as multi-layer, gradient, modulation, etc.

(9) Preparation of inorganic and organic composite structural coatings.

At present, the performance of a coating with a single structure or a single component is relatively single. To improve its protective performance, the thickness must be increased, and the increase in thickness will lead to a decrease in performance such as heat dissipation and signal transmission, etc.

BRIEF DESCRIPTION OF DRAWINGS

FIG. 1 is a flowchart of a method in accordance with an embodiment of the present invention.

DETAILED DESCRIPTION

The present invention provides a preparation method for an organosilicon nano-protective coating with a modulation structure to solve the above technical problems. In this preparation process, organosilicon coating preparation and organic fluorocarbon coating preparation are alternately performed to form an organosilicon/fluorocarbon modulation multilayer compact structure and composite modulation multilayer structure, which can greatly improve the protective performance of the coating without reducing heat conduction or signal transmission performance. The movement characteristics of a base material (e.g., a substrate) and the plasma discharge energy are linked. While the plasma discharge energy is output, the substrate remains in a moving state. A cross-linked structure is formed by the introduction of other monomer components with a multifunctional cross-linked structure by plasma energy to introduce additional cross-linking points. Plasma discharge generates plasma. Low temperature plasma can effectively activate active groups with higher energy in monomer components by controlling the relationship between plasma discharge energy and monomer bond energy to obtain active sites. At the same time, the introduced additional active sites cross-link and polymerize with each other in a plasma environment to form a dense network structure.

The technical solution adopted by the present invention is as follows: a preparation method for organosilicon nano-protective coating with a modulation structure, comprising the following steps: (A1) a pre-treatment step; (A2) a step of generating an organosilicon nano coating with modulation structure; and (A3) a post-treatment step.

(A1) Pre-treatment: A substrate is placed in a reaction chamber of a nano-coating preparation equipment, and the reaction chamber is continuously vacuumized. A vacuum degree within the reaction chamber is adjusted to 10 to 200 mTorr. An inert gas helium (He), argon (Ar), or a mixture of He and Ar is introduced, and a movement mechanism is turned on so that the substrate moves in the reaction chamber.

(A2) Preparation Method for Organosilicon Nano Coating with Modulation Structure: The following step I or II are performed for at least once to prepare an organosilicon nano-coating with a modulation structure on the surface of the substrate.

Step I: Monomer A vapor is introduced into the reaction chamber to achieve a vacuum degree of 30-300 mTorr. Plasma discharge is turned on for chemical vapor deposition. The introduction of monomer A vapor is stopped, and monomer B vapor is introduced. The plasma discharge is continued for chemical vapor deposition, and the introduction of monomer B vapor is stopped.

Step II: Monomer B vapor is introduced into the reaction chamber to achieve a vacuum degree of 30-300 mTorr. Plasma discharge is turned on for chemical vapor deposition, and the introduction of monomer B vapor is stopped. Monomer A vapor is introduced, and the plasma discharge is continued for chemical vapor deposition. The introduction of monomer A vapor is stopped.

The monomer A vapor can include: a mixture of at least one monofunctional unsaturated fluorocarbon resin and at least one polyfunctional unsaturated hydrocarbon or hydrocarbon derivative, and the mass fraction of the polyfunctional unsaturated hydrocarbon or hydrocarbon derivative in the monomer vapor is 15-65%.

The monomer B vapor can include: a mixture of (i) at least one organosilicon monomer containing a double bond, Si—Cl, Si—O—C, Si—N—Si, Si—O—Si structure or an annular structure and (ii) at least one polyfunctional unsaturated hydrocarbon or hydrocarbon derivative. The mass fraction of the polyfunctional unsaturated hydrocarbon or hydrocarbon derivative in the monomer vapor is 15-65%.

The monomer A vapor and monomer B vapor can be atomized and volatilized through a feeding pump and is then introduced into the reaction chamber at a low pressure of 10-200 mTorr. The flow rate of the introduced monomer A vapor and monomer vapor can be 10-1000 μL/min.

In the organosilicon nano-coating with a modulation structure, there can be multiple individual coating made during multiple forming cycles. Individual coating of each cycle is composed of a nano-level organosilicon coating and a nano-level organic fluorocarbon coating. The total thickness of the coating is 20 nm-10 μm. The hardness of the coating HB-4H.

(A3) Post-treatment: The plasma discharge is stopped, vacuumizing is continued, and the vacuum degree of the reaction chamber is kept as 10-200 mTorr for 1-5 minutes. Air is introduced to the reaction chamber until the pressure thereof reaches an atmospheric pressure. The movement of the substrate is stopped and then the substrate is taken out.

Alternatively, the plasma discharge is stopped, the reaction chamber is filled with air or an inert gas to a pressure of 2000-5000 mTorr, and then it is vacuumized to 10-200 mTorr. The above steps of inflating and vacuumizing are performed at least once. Air is introduced to the reaction chamber until the pressure thereof reaches an atmospheric pressure. The movement of the substrate is stopped, and then the substrate is taken out.

In step (A1), the substrate moves in the reaction chamber. The substrate is moved to reciprocate in a linear or a curve manner relative to the reaction chamber. The curved movement corresponds to a circular movement, an elliptical movement, a planetary movement, a spherical or other movement in irregularly curved paths, etc.

In step (A1), the substrate is a solid material. The solid material can be an electronic product, an electrical component, a semi-finished electronic assembly, a PCB board, a metal plate, a polytetrafluoroethylene sheet or an electronic component, and any interface of the surface of the substrate can be exposed to and used in water environment, mold environment, acid and alkaline solvent environment, acid and alkaline salt mist environment, acidic atmospheric environment, organic solvent immersion environment, cosmetics environment, sweat environment, cold and hot cycle impact environment or wet heat alternating environment after the preparation of the organosilicon nano-coating.

In step (A1), the reaction chamber can be a rotating chamber or a cubic chamber with a volume of 50-1000 L, the temperature of the reaction chamber can be controlled at 30-60° C., and the flow rate of the inert gas can be 5-300 SCCM.

In step (A2): a plasma discharge process is performed for chemical vapor deposition, and the plasma discharge process during the deposition process can include a low-power continuous discharge, a pulse discharge, or a periodic alternating discharge.

In some embodiments, the plasma discharge process during the deposition process is a low-power continuous discharge, and specifically includes the following deposition processes for at least once.

The deposition process includes a pre-treatment stage and a coating stage. The plasma discharge power in the pre-treatment stage is 150-600 W, and the continuous discharge time is 60-450 s. Then, in the coating stage, the plasma discharge power is adjusted to 10-150 W and the continuous discharge time is 600-3600 s.

In some embodiments, the plasma discharge process during the deposition process is a pulse discharge, and specifically includes the following deposition processes for at least once.

The deposition process includes a pre-treatment stage and a coating stage. The plasma discharge power in the pre-treatment stage is 150-600 W, and the continuous discharge time is 60-450 s. Then, in the coating stage, a pulse discharge, with the power of 10-300 W and time of 600 s to 3600 s, is performed. The pulse discharge frequency is 1-1000 HZ, and the duty cycle of the pulse is 1:1-1:500.

In some embodiments, the plasma discharge process during the deposition process is a periodic alternating discharge, and specifically includes the following deposition processes for at least once.

The deposition process includes a pre-treatment stage and a coating stage. The plasma discharge power in the pre-treatment stage is 150-600 W, and the continuous discharge time is 60-450 s. Then, during the coating phase, the plasma is periodically alternating discharge output, with the power of 10-300 W, time of 600 s to 3600 s and AC frequency of 1-1000 Hz. The waveform of the plasma periodically alternating discharge output is a sawtooth waveform, sine waveform, square wave waveform, full-wave rectified waveform or half-wave rectified waveform.

The monofunctional unsaturated fluorocarbon resin can include: 3-(perfluoro-5-methylphenyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluorooctyl ethyl acrylate, 1H, 1H, 2H, 2H-perfluorooctyl acrylate, 2-(perfluorobutyl) ethyl acrylate, (2H-perfluoropropyl)-2-acrylate, (perfluorocyclohexyl) methacrylate, 3,3,3-trifluoro-1-propyne, 1-ethynyl-3, 5-difluorobenzene, or 4-ethynyltrifluorotoluene.

The organosilicon monomer containing a double bond, Si—Cl, Si—O—C, Si—N—Si, Si—O—Si structure or an annular structure includes:

Organosilicon monomers containing a double bond structure, such as, allyltrimethoxysilane, vinyltriethoxysilane, vinyltrimethylsilane, 3-butenyltrimethylsilane, vinyltris(methylethylketoxime)silane, tetramethyldivinyldisiloxane, and 1,2,2-trifluorovinyltriphenylsilane.

Organosilicon monomers containing a Si—Cl bond, such as, triphenylchlorosilane, methylvinyldichlorosilane, trichloro(3,3,3-trifluoropropyl)silane, trifluoropropylmethyldichlorosilane, dimethylphenylchlorosilane, tributylchlorosilane, and benzyldimethylchlorosilane.

Organosilicon monomers containing a Si—O—C structure, such as, tetramethoxysilane, trimethoxyhydrosiloxane, n-octyltriethoxysilane, phenyltriethoxysilane, vinyltris(2-methoxythoxy)silane, triethylvinylsilane, hexaethylcyclotrisiloxane, 3-(methacryloyloxy)propyltrimethoxysilane, phenyltris(trimethylsiloxy)silane, diphenyldiethoxysilane, dodecyltrimethoxysilane, n-octyltriethoxysilane, dimethoxysilane, and 3-chloropropyltrimethoxysilane.

Organosilicon monomers containing a Si—N—Si or Si—O—Si structure, such as, hexamethyldisilazane, hexamethylcyclotrisilaneamino, hexamethyldisilazane, and hexamethyl disiloxane.

Organosilicon monomers containing an annular structure, such as, hexamethylcyclotrisiloxane, octamethylcyclotetrasiloxane, hexaphenylcyclotrisiloxane, decamethylcyclopentasiloxane, octaphenylcyclotetra siloxane, triphenylhydroxysilane, diphenyldihydroxysilane, bis(triphenylsilyl) ester, trifluoropropylmethylcyclotrisiloxane, 2,2,4,4-tetramethyl-6,6,8,8-tetraphenylcyclotetrasiloxane, tetramethyltetravinylcyclotetrasiloxane, (3-glycidyloxypropyl) triethoxysilane, and 3-glycidyloxypropyltrimethoxysilane.

The polyfunctional unsaturated hydrocarbons and hydrocarbon derivatives can include: 1,3-butadiene, isoprene, 1,4-pentadiene, ethoxylated trimethylolpropane triacrylate, tripropylene glycol diacrylate, polyethylene glycol diacrylate, 1,6-hexanediol diacrylate, ethylene glycol diacrylate, diethylene glycol divinyl ether, or neopentyl glycol diacrylate.

In step (A2), the plasma discharge mode is radio frequency discharge, microwave discharge, intermediate frequency discharge, high frequency discharge, electric spark discharge, and the waveforms of the high frequency discharge and intermediate frequency discharge are sinusoidal or bipolar pulses. The RF plasma is a plasma generated by a high-frequency electromagnetic field discharge. In microwave methods, microwave energy is used to excite the plasma, which has the advantage of high energy utilization efficiency. At the same time, because of electrodeless discharge, the plasma is pure. It is an excellent method for high-quality, high-speed and large-area preparation.

In a low-vacuum plasma discharge environment, more active free radicals can be formed through effective output of energy and control of chemical bond breaks in monomers with a more active molecular structure, and the excited free radicals and surface active groups of products such as mobile phones initiate polymerization by means of chemical bond bonding, and a nano-coating with a modulation structure is formed on the surface of the substrate.

During the coating preparation process, the movement characteristics of the substrate and the plasma discharge energy are linked. At the time of the plasma discharge during the preparation process, the substrate moves, which improves the coating deposition efficiency and improves the uniformity and compactness of the coating thickness.

The prepared coating is waterproof and moisture proof, mildew resistant, acid and alkaline solvent resistant, acid and alkaline salt spray resistant, acidic atmosphere resistant, organic solvent immersion resistant, cosmetics resistant, sweat resistant, resistant to cold and heat cycle impact (e.g., −50° C. to +85° C.), resistant to humidity and heat change (e.g., 75%-95% of humidity) and has other characteristics. In addition to the above-mentioned protective properties, in case of a thickness of 1-1000 nm, the effect of the coating on the RF communication signals with frequency of 10M-8 G is less than 5%.

Compared with the current art, the above technical solution of the present invention has the following advantages:

1. The present invention adopts a method of alternately preparing an organosilicon coating and an organic fluorocarbon coating to form an organosilicon/fluorocarbon modulation multilayer compact structure, which can reduce the stress of the coating and improve the toughness of the coating. At the same time, due to the horizontal interface between the organosilicon and fluorocarbon, the corrosion will develop laterally when it encounters the horizontal interface during the corrosion process of the coating by the corrosive medium. It is not easy to form longitudinal corrosion that penetrates the coating so as to prevent the corrosive medium from corroding the protected materials and devices through the coating.

2. The present invention uses plasma chemical vapor deposition to obtain a nano-protective coating with a modulation structure by controlling the monomer and the coating structure. This coating has the following advantages: each cycle consists of a nano-level organosilicon coating and a nano-level organic fluorocarbon coating. The total thickness of the coating can be controlled to 20 nm-10 μm. The hardness is controllable to HB-4H. At the same time, it has excellent insulation performance, resistance to underwater electricity and three-proof performance.

3. Compared with the ordinary single-time long-term coating, the coating obtained by the method of the present invention improves the binding force and compactness of the coating by at least 40%-50% and 35%-50% respectively. The coating with a modulation structure obtained byperiodic alternating discharge has excellent performance and strong practicability.

4. The substrate moves in the reaction chamber, making the thickness of the substrate coating in different positions tend to be the same, which solves the problem of uneven thickness of the surface coating of the substrate due to the different monomer density in different regions of the reaction chamber.

5. During the preparation process, the movement characteristics of the substrate and the plasma discharge energy are linked. While the discharge energy is output, the substrate moves, which improves the deposition efficiency and significantly improves the compactness of the resulted protective coating with a modulation structure. At the same time, due to the increased deposition efficiency, the amount of chemical monomer raw materials used for monomer vapor is only 10%-15% of that used in other existing technologies, thereby reducing emission of exhaust gas. It is more environmentally friendly and is of great significance in improving actual production efficiency.

6. The introduction of multifunctional cross-linking structure in the monomer material promotes the formation of the dense network structure of the coating on the microstructure, which not only ensures hydrophobicity but also improves the resistance to acid/alkali corrosion of the environment.

Electronic equipment in daily life is easily damaged by the corrosion of the corrosive environment and is basically in the corrosive environment during the use process. After a long time, it will cause irreparable damage to electronic equipment. The coating method of the present invention greatly improves the great significance of nanometer in improving the actual production efficiency. It improves the service life of the coating in corrosive environment and the protection effect of the product. It is mainly used in the following products.

(1) Portable device keyboard: The portable keyboard is small and light, and is often used in computers, mobile phones and other devices. It is convenient for users to work during trip. However, when it encounters contamination of common liquids, such as the accidental overturning of the tea cup, the infiltration of rain and sweat, the keyboard is easily short-circuited and then damaged. After the keyboard is coated with this type of nano-coating, it can ensure that the keyboard surface is easy to clean, and the function is intact after contact with water, so that the keyboard can adapt to more severe environment.

(2) LED display: LED display is used for product promotion, store decoration, lighting, warning, and other purposes. Some of its applications are in harsh environment of rain or dust. During rainy days, the outdoor LED advertising screens in shopping malls, road warning lights and LED display control panels in production workshops, etc. are easy to fail, and dust is easy to be accumulated and it is difficult to clean. After application of this nano-coating, the above problems can be effectively solved.

(3) Intelligent fingerprint lock: Fingerprint lock is a smart lock, which integrates computer information technology, electronic technology, mechanical technology, and modern hardware technology, and is widely used in the public security criminal investigation and judicial fields. However, its internal circuit is easily short-circuited in case of water, it is difficult to repair and requires violent unlocking. This problem can be avoided after using this coating.

(4) Hearing aids and Bluetooth headsets: There are no communication cables for hearing aids or Bluetooth headsets. After this coating is applied, users can use such products in a water environment for a certain period of time, such as bathing, rainy days, and the devices will not be damaged due to rain water.

(5) Sensors: Some sensors need to work in a liquid environment, such as water pressure and oil pressure sensors, sensors used in underwater operating equipment and sensors that often encounter water in the working environment. These sensors will not fail due to the invading of liquid into the internal structure of the mechanical equipment after this coating is applied.

(6) 3M products: such as mobile phones, notebooks, PSP, etc.

(7) Other equipment that needs to be waterproof: It includes equipment that needs to work in a humid environment, or that may encounter accidents such as common liquid spill, which will affect the normal operation of the internal weak current lines.

The organosilicon nano-coating with a modulation structure prepared by this method can also be applied to the following different environments and related products involving:

Waterproof, moisture-proof and mold-proof: such as (1) house interior parts: bathroom ceiling, wallpaper, chandeliers, curtains and window screens; (2) daily necessities: mosquito nets, lampshades, chopstick baskets and car rear-view mirrors; (3) cultural relics and artworks: copybooks, antiques, wood carvings, leather, bronzes, silk, costumes and ancient books; (4) electronic components and electronic products: sensors (operating in wet or dusty environment), chips of various electronic products (electronic blood pressure monitors and smart watches), circuit boards, mobile phones, LED screens and hearing aids; (5) precision instruments and optical equipment: mechanical watches and microscopes; and (6) agricultural/police/civil drones.

Resistance to acid and alkaline solvents, acid and alkaline salt spray and acidic atmosphere: (1) housing interior parts: wallpaper and tiles; (2) protective equipment: acid-resistant (alkali) gloves and acid-resistant (alkali) protective clothing; (3) mechanical equipment and pipelines: flue gas desulfurization equipment, seals (acid/alkaline lubricating oil), pipelines, valves, large-diameter marine transmission pipeline linings, etc.; (4) various reaction kettles and reactors; (5) chemical production and storage; sewage treatment and aeration tanks; and (6) others: acid-alkali workshops, alkali-proof aerospace, energy and power, steel metallurgy, petrochemicals, medical and other industries, storage containers, statues (reducing corrosion of acid rain on them) and sensors (in acid/alkaline environment).

Resistance to organic solvents, cosmetics and sweat: such as (1) paraffins, olefins, alcohols, aldehydes, amines, esters, ethers, ketones, aromatic hydrocarbons, hydrogenated hydrocarbons, terpen hydrocarbons, halogenated hydrocarbons, heterocyclic compounds, solvents containing nitrogen compounds and sulfur compounds; (2) cosmetics packaging container; and (3) fingerprint locks and earphones.

Resistance to cold and heat cycle impact (e.g., −40° C. to +100° C.) and resistance to humidity and heat alternating (e.g., humidity: 75%-95%): electrical, electronic and automotive electrical appliances, such as equipment in the fields of aviation, automotive, home appliances, scientific research and so on.

The present invention is described in detail below with reference to specific embodiments, but the present invention is not limited to the specific embodiments.

Embodiment A1

A preparation method for organosilicon nano-protective coating with a modulation structure, comprising the following steps: (1) a pre-treatment step; (2) a step of generating an organosilicon nano coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 10 mTorr, an inert gas Ar is introduced, and a movement mechanism is turned on so that the substrate moves in the reaction chamber, In step (1), the substrate is a solid material. The solid material can be a block aluminum material and a PCB board, and any interface of the substrate may be exposed to a humid heat test environment after a cold and heat cycle impact resistance coating is prepared.

In step (1), the reaction chamber can be a rotating chamber with a volume 50 L, the temperature of the reaction chamber can be controlled at 30° C., and the flow rate of the inert gas can be 5 SCCM.

In step (1), the substrate is moved in the reaction chamber, and the substrate can be moved in a circular manner relative to the reaction chamber at a speed of 3 rpm.

(2) Preparation Method for Organosilicon Nano Coating with Modulation Structure: The following step I is performed for once to prepare an organosilicon nano-coating with a modulation structure on the surface of the substrate.

Step I: Monomer A vapor is introduced into the reaction chamber to achieve a vacuum degree of 30 mTorr. Plasma discharge is turned on for chemical vapor deposition. The introduction of monomer A vapor is stopped, and monomer B vapor is introduced. The plasma discharge is continued for chemical vapor deposition. The introduction of monomer B vapor is stopped.

The monomer A vapor can include: a mixture of one monofunctional unsaturated fluorocarbon resin and at least three polyfunctional unsaturated hydrocarbon or hydrocarbon derivative. The mass fraction of the polyfunctional unsaturated hydrocarbon or hydrocarbon derivative in the monomer vapor is 15%.

The one monofunctional unsaturated fluorocarbon resin and the three polyfunctional unsaturated hydrocarbons and hydrocarbon derivatives can include: 2-(perfluorododecyl) ethyl acrylate, 1,4-pentadiene, tripropylene glycol diacrylate, and 1,6-hexanediol diacrylate.

The monomer B vapor can include: a mixture of an organosilicon monomer containing a double bond structure and two polyfunctional unsaturated hydrocarbons or hydrocarbon derivatives, and the mass fraction of the polyfunctional unsaturated hydrocarbons or hydrocarbon derivatives in the monomer vapor is 45%.

The one organosilicon monomer containing a double bond structure and two polyfunctional unsaturated hydrocarbons or hydrocarbon derivatives are respectively: 3-butenyltrimethylsilane, isoprene, and diethylene glycol divinyl ether.

In step (2), a plasma discharge process can be performed for chemical vapor deposition. The plasma discharge process during the deposition process is a low-power continuous discharge, and specifically includes the following deposition processes for once.

The deposition process includes a pre-treatment stage and a coating stage. The plasma discharge power in the pre-treatment stage is 150 W, and the continuous discharge time is 450 s. Then, in the coating stage, the plasma discharge power is adjusted to 10 W and the continuous discharge time is 3600 s.

The monomer A vapor and monomer B vapor are atomized and volatilized through a feeding pump and is then introduced into the reaction chamber at a low pressure of 10 mTorr, and the flow rate of the introduced monomer A vapor and monomer vapor is 10 μL/min.

In the organosilicon nano-coating with a modulation structure, the coating of each cycle is composed of a nano-level organosilicon coating and a nano-level organic fluorocarbon coating. The total thickness of the coating is 20 nm; and the hardness of the coating HB.

The plasma discharge mode in step (2) can be a radio frequency discharge.

(3) Post-treatment: The plasma discharge is stopped, vacuumizing is continued, and the vacuum degree of the reaction chamber is kept as 10 mTorr for 1 min. Air is introduced to the reaction chamber until the pressure thereof reaches an atmospheric pressure, and then the substrate is taken out.

The obtained coated aluminum material and PCB board are tested for their resistance to cold and heat cycle impact and their resistance to moisture and heat, and the test results are as follows.

(1) Cold and hot cycle impact test results:

| Test substrate | Experimental conditions | Times of cycle | Experiment time | Result detection |
|---|---|---|---|---|
| Block aluminum material | −40° C.~+75° C. | 40 | 8 h | Good appearance without affecting performance |
| PCB board | −40° C.~+75° C. | 40 | 8 h | Good appearance without affecting performance |

(2) Results of humid heat alternating test:

| Test substrate | Test conditions and results | | | | | | |
|---|---|---|---|---|---|---|---|
| Experimental conditions | Temperature | | 85° C. | | | | |
| | Humidity | | 75% | 80% | 85% | 90% | 95% |
| Block aluminum material | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |
| | Time | 96 h | Pass | Pass | Pass | Pass | Pass |

Embodiment A2

A preparation method for organosilicon nano-protective coating with a modulation structure, comprising the following steps: (1) a pre-treatment step; (2) a step of generating an organosilicon nano coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 60 mTorr, an inert gas He is introduced, and a movement mechanism is turned on so that the substrate moves.

In step (1), the substrate is a solid material, and the solid material can be a block aluminum material, and any interface of the substrate may be exposed to a humid heat alternating environment after a humid heat resistant coating is prepared.

In step (1), the volume of the reaction chamber can be 280 L, the temperature of the reaction chamber can be controlled at 40° C., and the flow rate of the inert gas can be 15 SCCM.

In step (1), the substrate is moved to perform a planetary movement at a revolution speed of 8 rpm and a rotation speed of 5 rpm.

(2) Preparation method for organosilicon nano-coating with modulation structure: The following step I is performed for four times to prepare an organosilicon nano-coating with a modulation structure on the surface of the substrate.

Step I: Monomer A vapor is introduced into the reaction chamber to achieve a vacuum degree of 90 mTorr. Plasma discharge is turned on for chemical vapor deposition, the introduction of monomer A vapor is stopped. Monomer B vapor is introduced, the plasma discharge is continued for chemical vapor deposition, and the introduction of monomer B vapor is stopped.

The monomer A vapor composition can include: a mixture of three monofunctional unsaturated fluorocarbon resin and one polyfunctional unsaturated hydrocarbon or hydrocarbon derivative, and the mass fraction of the polyfunctional unsaturated hydrocarbon or hydrocarbon derivative in the monomer vapor is 36%.

The three monofunctional unsaturated fluorocarbon resins and the one polyfunctional unsaturated hydrocarbon and hydrocarbon derivative can be: 2-(perfluorodecyl) ethyl methacrylate, 2-(perfluorohexyl) ethyl methacrylate, 2-(perfluorododecyl) ethyl acrylate, and 1,6-hexanediol diacrylate.

The monomer B vapor composition can be: a mixture of four organosilicon monomers containing a Si—Cl structure and one polyfunctional unsaturated hydrocarbon or hydrocarbon derivative, and the mass fraction of the polyfunctional unsaturated hydrocarbons or hydrocarbon derivatives in the monomer vapor is 15%.

The four organosilicon monomers containing a Si—Cl structure and one polyfunctional unsaturated hydrocarbon or hydrocarbon derivative can be: trichloro(3,3,3-trifluoropropyl)silane, trifluoropropylmethyldichlorosilane, dimethylphenylchlorosilane, tributylchlorosilane, and ethoxylated trimethylolpropane triacrylate.

In step (2), a plasma discharge process is performed for chemical vapor deposition. The plasma discharge process during the deposition process is a low-power continuous discharge, and specifically includes the following deposition processes for five times.

The deposition process includes a pre-treatment stage and a coating stage. The plasma discharge power in the pre-treatment stage is 600 W, and the continuous discharge time is 60 s. Then, in the coating stage, the plasma discharge power is adjusted to 150 W and the continuous discharge time is 600 s.

The monomer A vapor and monomer B vapor are atomized and volatilized through a feeding pump and is then introduced into the reaction chamber at a low pressure of 60 mTorr, and the flow rate of the introduced monomer A vapor and monomer vapor is 140 μL/min.

In the organosilicon nano-coating with a modulation structure, the coating of each cycle is composed of a nano-level organosilicon coating and a nano-level organic fluorocarbon coating. The total thickness of the coating is 40 nm, and the hardness of the coating is 2H.

The plasma discharge mode in step (2) can be a microwave discharge.

(3) Post-treatment: The plasma discharge is stopped, vacuumizing is continued, and the vacuum degree of the reaction chamber is kept as 90 mTorr for 2 minutes. Air is introduced to the reaction chamber until the pressure thereof reaches an atmospheric pressure, and then the substrate is taken out.

The obtained coated aluminum material is tested for their resistance to cold and heat cycle impact and their resistance to moisture and heat, and the test results are as follows:

(1) Cold and hot cycle impact test results:

| Test substrate | Experimental conditions | Times of cycle | Experiment time | Result detection |
|---|---|---|---|---|
| Aluminum material | −40° C.~+75° C. | 40 | 8 h | No impact on appearance Good performance |

(2) Results of humid heat alternating test:

| Test substrate | Test conditions and results | | | | | | |
|---|---|---|---|---|---|---|---|
| Experimental conditions | Temperature | | 85° C. | | | | |
| | Humidity | | 75% | 80% | 85% | 90% | 95% |
| Block aluminum material | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |
| | Time | 96 h | Pass | Pass | Pass | Pass | Pass |

Embodiment A3

A preparation method for organosilicon nano-protective coating with a modulation structure, comprising the following steps: (1) a pre-treatment step; (2) a step of generating an organosilicon nano coating with a modulation structure; and (3) a post-treatment step.

(1) Pre-treatment: A substrate is placed in a reaction chamber of a nano-coating preparation equipment, the reaction chamber is closed and continuously vacuumized, and the vacuum degree within the reaction chamber is adjusted to 120 mTorr. An inert gas Ar is introduced and a movement mechanism is turned on so that the substrate is moved.

In step (1), the substrate is a solid material, and the solid material can be a block polytetrafluoroethylene plate and an electrical component, and any interface of the block polytetrafluoroethylene plate can be exposed to and used in the GJB150.10A-2009 mold test environment after a mold-proof coating is prepared on the surface. Any interface of the electrical component can be exposed to and used in the environment described in the international industrial waterproof grade standard IPX7 after a waterproof and electrical breakdown resistant coating is prepared on the surface.

In step (1), the volume of the reaction chamber is 480 L, the temperature of the reaction chamber is controlled at 50° C., and the flow rate of the inert gas is 50 SCCM.

In step (1), the substrate is moved to perform a circular movement at a speed of 10 rpm.

(2) Preparation Method for Organosilicon Nano Coating with Modulation Structure: The following step II is performed for 15 times to prepare an organosilicon nano-coating with a modulation structure on the surface of the substrate.

Step II: Monomer B vapor is introduced into the reaction chamber to achieve a vacuum degree of 180 mTorr, the plasma discharge is turned on for chemical vapor deposition, and the introduction of monomer B vapor is stopped. Monomer A vapor is introduced, the plasma discharge is continued for chemical vapor deposition, and the introduction of monomer A vapor is stopped.

The monomer A vapor composition is: a mixture of four monofunctional unsaturated fluorocarbon resins and two polyfunctional unsaturated hydrocarbons or hydrocarbon derivatives, and the mass fraction of the polyfunctional unsaturated hydrocarbon or hydrocarbon derivative in the monomer vapor is 65%.

The four monofunctional unsaturated fluorocarbon resins and the two polyfunctional unsaturated hydrocarbons and hydrocarbon derivatives are: 2-perfluorododecyl) ethyl acrylate, 2-perfluorooctyl ethyl acrylate, 2-(perfluorobutyl) ethyl acrylate, (2H-perfluoropropyl)-2-acrylate, tripropylene glycol diacrylate, and polyethylene glycol diacrylate.

The monomer B vapor composition is: a mixture of (i) three organosilicon monomers containing a Si—O—C structure and (ii) four polyfunctional unsaturated hydrocarbons or hydrocarbon derivatives. The mass fraction of the polyfunctional unsaturated hydrocarbons or hydrocarbon derivatives in the monomer vapor is 49%.

The three organosilicon monomers containing a Si—O—C structure and four polyfunctional unsaturated hydrocarbons or hydrocarbon derivatives are respectively: vinyltris(2-methoxythoxy)silane, hexaethylcyclotrisiloxane, 3-(methacryloyloxy)propyltrimethoxysilane, isoprene, 1,4-pentadiene, ethoxylated trimethylolpropane triacrylate, and 1,6-hexanediol diacrylate.

In step (2), plasma discharge for chemical vapor deposition, wherein the plasma discharge process during the deposition process is pulse discharge, and specifically includes the following deposition processes for once.

The deposition process includes a pre-treatment stage and a coating stage. The plasma discharge power in the pre-treatment stage is 150 W, and the continuous discharge time is 450 s. Then, in the coating stage, a pulse discharge can be performed, with the power of 10 W and time of 3600 s. The pulse discharge frequency is 1 HZ, and the duty cycle of the pulse is 1:500.

The monomer A vapor and monomer B vapor are atomized and volatilized through a feeding pump and is then introduced into the reaction chamber at a low pressure of 100 mTorr. The flow rate of the introduced monomer A vapor and monomer vapor is 260 μL/min.

In the organosilicon nano-coating with a modulation structure, the coating of each cycle is composed of a nano-level organosilicon coating and a nano-level organic fluorocarbon coating. The total thickness of the coating is 120 nm; and the hardness of the coating is 2H.

The plasma discharge mode in step (2) is an intermediate-frequency discharge, and the waveform of the intermediate-frequency discharge is a bipolar pulse.

(3) Post-treatment: The plasma discharge is stopped, vacuumizing is continued, and the vacuum degree of the reaction chamber is kept as 200 mTorr for 5 minutes. Air is introduced to the reaction chamber until the pressure thereof reaches an atmospheric pressure, and then the substrate is taken out.

After the above polytetrafluoroethylene board is coated, its contact angle is tested. Its mold resistance is also tested according to the GJB150.10A-2009 standard. The test results are as follows:

| Water contact angle | 134° |
|---|---|
| Oil contact angle | 93° |
| Mold resistance grade | Grade 2 |
| Degree of surface mold spots | 4% |

Test results of underwater immersion tests at different voltages after coating is prepared for the above electrical components are as follows:

| Time to reach 1 mA at a certain voltage | | |
|---|---|---|
| 3.8 V | 5 V | 12.5 V |
| >70 h | >52 h | >48 h |

IPX7 waterproof rating test (1 meter underwater immersion test for 30 minutes) results are as follows:

| IPX7 waterproof grade test | |
|---|---|
| Embodiment A3 | Electrical components work properly. |

Embodiment A4

A preparation method for organosilicon nano-protective coating with a modulation structure, comprising the following steps: (1) a pre-treatment step; (2) a step of generating an organosilicon nano coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 140 mTorr, an inert gas He is introduced, and a movement mechanism is turned on so that the substrate is moved.

In step (1), the substrate is a solid material, the solid material can be a block polytetrafluoroethylene plate and an electrical component, and any interface of the block polytetrafluoroethylene plate can be exposed to and used in the GJB150.10A-2009 mold test environment after a mold-proof coating is prepared on the surface. Any interface of the electrical component can be exposed to and used in the environment described in the international industrial waterproof grade standard IPX7 after a waterproof and electrical breakdown resistant coating is prepared on the surface.

In step (1), the volume of the reaction chamber is 680 L, the temperature of the reaction chamber is controlled at 50° C., and the flow rate of the inert gas is 160 SCCM.

In step (1), the substrate linearly is moved to reciprocate at a movement speed of 20 mm/min.

(2) Preparation Method for Organosilicon Nano-Coating with Modulation Structure: The following step II is performed for 40 times to prepare an organosilicon nano-coating with a modulation structure on the surface of the substrate.

Step II: Monomer B vapor is introduced into the reaction chamber to achieve a vacuum degree of 200 mTorr, plasma discharge is turned on for chemical vapor deposition, and the introduction of monomer B vapor is stopped. Monomer A vapor is introduced, the plasma discharge is continued for chemical vapor deposition, and the introduction of monomer A vapor is stopped.

The monomer A vapor composition is: a mixture of two monofunctional unsaturated fluorocarbon resins and five polyfunctional unsaturated hydrocarbons or hydrocarbon derivatives, and the mass fraction of the polyfunctional unsaturated hydrocarbon or hydrocarbon derivative in the monomer vapor is 45%.

The two monofunctional unsaturated fluorocarbon resins and the five polyfunctional unsaturated hydrocarbons and hydrocarbon derivatives are: 3,3,3-trifluoro-1-propyne, 1-ethynyl-3, 5-difluorobenzene, 1,3-butadiene, 1,4-pentadiene, ethoxylated trimethylolpropane triacrylate, tripropylene glycol diacrylate and polyethylene glycol diacrylate.

The monomer B vapor composition is: a mixture of two organosilicon monomers containing a Si—N—Si or Si—O—Si structure and three polyfunctional unsaturated hydrocarbons or hydrocarbon derivatives, and the mass fraction of the polyfunctional unsaturated hydrocarbons or hydrocarbon derivatives in the monomer vapor is 28%.

The two organosilicon monomers containing a Si—N—Si or Si—O—Si structure and three polyfunctional unsaturated hydrocarbons or hydrocarbon derivatives are: hexamethyldisilazane,hexamethyl disiloxane, 1,4-pentadiene, ethoxylated trimethylolpropane triacrylate, and neopentyl glycol diacrylate.

In step (2), a plasma discharge process is performed for chemical vapor deposition. The plasma discharge process during the deposition process is a pulse discharge, and specifically includes the following deposition processes for six times.

The deposition process includes a pre-treatment stage and a coating stage. The plasma discharge power in the pre-treatment stage is 600 W, and the continuous discharge time is 60 s. Then, in the coating stage, a pulse discharge is performed, with the power of 300 W and time of 600 s. The pulse discharge frequency is 1000 HZ, and the duty cycle of the pulse is 1:1.

The monomer A vapor and monomer B vapor are atomized and volatilized through a feeding pump and is then introduced into the reaction chamber at a low pressure of 130 mTorr, and the flow rate of the introduced monomer A vapor and monomer vapor is 520 μL/min.

In the organosilicon nano-coating with a modulation structure, the coating of each cycle is composed of a nano-level organosilicon coating and a nano-level organic fluorocarbon coating. The total thickness of the coating is 600 nm, and the hardness of the coating is 3H.

The plasma discharge mode in step (2) is a high-frequency discharge, and the waveform of the high-frequency discharge is sinusoidal.

(3) Post-treatment: The plasma discharge is stopped, the reaction chamber is filled with an inert gas to a pressure of 5000 mTorr, and then it is vacuumized to 200 mTorr. The above steps of inflating and vacuumizing are performed for five times. Air is introduced to the reaction chamber until the pressure thereof reaches an atmospheric pressure. The movement of the substrate is stopped, and then the substrate is taken out.

After the above polytetrafluoroethylene board is coated, its contact angle is tested, and the mold resistance is tested according to the GJB150.10A-2009 standard. The test results are as follows:

| Water contact angle | 138° |
|---|---|
| Oil contact angle | 99° |
| Mold resistance grade | Grade 2 |
| Degree of surface mold spots | 4% |

Test results of underwater immersion tests at different voltages after coating is prepared for the above electrical components are as follows:

| Time to reach 1 mA at a certain voltage | | |
|---|---|---|
| 3.8 V | 5 V | 12.5 V |
| >70 h | >52 h | >48 h |

IPX7 waterproof rating test (1 m underwater immersion test for 30 minutes) results are as follows:

| IPX7 waterproof grade test | |
|---|---|
| Embodiment A4 | Electrical components work properly. |

Embodiment A5

A preparation method for organosilicon nano-protective coating with a modulation structure, comprising the following steps: (1) a pre-treatment step; (2) a step of generating an organosilicon nano coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 220 mTorr, an inert gas Ar is introduced, and a movement mechanism is turned on so that the substrate is moved.

In step (1), the substrate is a solid material, and the solid material can be a block aluminum material, and any interface of the substrate may be exposed to an acid and alkaline test environment after an acid and alkaline resistant coating is prepared.

In step (1), the volume of the reaction chamber is 1000 L, the temperature of the reaction chamber is controlled at 60° C., and the flow rate of the inert gas is 300 SCCM.

In step (1), the substrate is moved to perform a planetary movement at a revolution speed of 6 rpm and a rotation speed of 8 rpm.

(2) Preparation Method for Organosilicon Nano Coating with Modulation Structure: The following step II is performed for 500 times to prepare an organosilicon nano-coating with a modulation structure on the surface of the substrate.

Step II: Monomer B vapor is introduced into the reaction chamber to achieve a vacuum degree of 300 mTorr, plasma discharge is turned on for chemical vapor deposition, and the introduction of monomer B vapor is stopped. Monomer A vapor is introduced, the plasma discharge is continued for chemical vapor deposition, and the introduction of monomer A vapor is stopped.

The monomer A vapor composition is: a mixture of three monofunctional unsaturated fluorocarbon resins and three polyfunctional unsaturated hydrocarbons or hydrocarbon derivatives, and the mass fraction of the polyfunctional unsaturated hydrocarbon or hydrocarbon derivative in the monomer vapor is 54%.

The three monofunctional unsaturated fluorocarbon resins and the three polyfunctional unsaturated hydrocarbons and hydrocarbon derivatives are: 1H, 1H, 2H, 2H-perfluorooctyl acrylate, 2-(perfluorobutyl) ethyl acrylate, (2H-perfluoropropyl)-2-acrylate, 1,4-pentadiene, tripropylene glycol diacrylate, and polyethylene glycol diacrylate.

The monomer B vapor composition is: a mixture of four organosilicon monomers containing an annular structure and three polyfunctional unsaturated hydrocarbons or hydrocarbon derivatives, and the mass fraction of the polyfunctional unsaturated hydrocarbons or hydrocarbon derivatives in the monomer vapor is 36%.

The four organosilicon monomers containing an annular structure and three polyfunctional unsaturated hydrocarbons or hydrocarbon derivatives are respectively: hexamethylcyclotrisiloxane, octamethylcyclotetrasiloxane, 3-glycidyloxypropyl)triethoxysilane, 3-glycidyloxypropyltrimethoxysilane, polyethylene glycol diacrylate, 1,6-hexanediol diacrylate, and ethylene glycol diacrylate.

In step (2), a plasma discharge process is performed for chemical vapor deposition, and the plasma discharge process during the deposition process is a periodic alternating discharge, and specifically includes the following deposition processes for once.

The deposition process includes a pre-treatment stage and a coating stage. The plasma discharge power in the pre-treatment stage is 150 W, and the continuous discharge time is 450 s. During the coating phase, the plasma is periodically alternating discharge output, with the power of 10 W, time of 3600 s and AC frequency of 1 Hz. The waveform of the plasma periodically alternating discharge output is a sine waveform.

The monomer A vapor and monomer B vapor are atomized and volatilized through a feeding pump and is then introduced into the reaction chamber at a low pressure of 200 mTorr. The flow rate of the introduced monomer A vapor and monomer vapor is 1000 μL/min.

In the organosilicon nano-coating with a modulation structure, the coating of each cycle is composed of a nano-level organosilicon coating and a nano-level organic fluorocarbon coating. The total thickness of the coating is 10 μm. The hardness of the coating is 4H.

The plasma discharge mode in step (2) is an electric spark discharge.

(3) Post-treatment: The plasma discharge is stopped, the reaction chamber is filled with an inert gas to a pressure of 2000 mTorr, and then it is vacuumized to 10 mTorr, the above steps of inflating and vacuumizing are performed once, air is introduced to an atmospheric pressure, the movement of the substrate is stopped, and then the substrate is taken out.

The test effects of the above-mentioned coated aluminum materials are as follows:

(1) Hydrophobicity and oleophobicity

| | Hydrophobicity/oleophobicity | | |
|---|---|---|---|
| | Water contact angle | Oil contact angle | Adhesion |
| Embodiment A5 | 139° | 96° | Low adhesion and water droplets are easy to slide. |

(2) Test results of resistance to organic solvents are as follows ("pass" means that the contact angle change is less than 5° after immersion for a period of time).

| Chemical | Time | | | |
|---|---|---|---|---|
| reagent | 64 h | 112 h | 160 h | 208 h |
| Acetone | pass | pass | pass | pass |
| Cyclohexane | pass | pass | pass | pass |
| Petroleum ether | pass | pass | pass | pass |
| Xylene | pass | pass | pass | pass |
| n-propanol | pass | pass | pass | pass |

(3) Acid and alkali test results are as follow ("pass" means that no corrosion occurs after experiment for a period of time).

| Acid and alkaline | Time | | | |
|---|---|---|---|---|
| reagent | 64 h | 112 h | 160 h | 208 h |
| Acid salt spray | pass | pass | pass | pass |
| Neutral salt spray | pass | pass | pass | pass |
| Alkaline salt spray | pass | pass | pass | pass |
| 5% acetic acid solution | pass | pass | pass | pass |
| 5% NaOH solution | pass | pass | pass | pass |

Hard Nano-Protective Coating with Composite Structure—Embodiments B1-B6

The present invention provides a preparation method for a high-insulation hard nano-protective coating with a composite structure. In the preparation process, low dipole moment and highly chemically inert organosilicon monomers are filtered out. Then the free volume and compactness of the coating are regulated via a polyfunctional monomer, so that the coating has high insulation performance, excellent protection performance, and abrasion resistance. An organosilicon coating is deposited on a high-insulation coating, and surface hardening is performed to form a hard coating with a compact structure.

Because the plasma chemical vapor deposition method is not only applicable to a variety of monomers but also has a strong controllability of the composition and structure of the formed coating. Thus, the composition and structure of the coating can be regulated and constructed by optimizing the design of the monomer and optimization of process parameters, so that low dipole moment monomer and high hardness organosilicon monomer can be organically combined to form a coating with high insulation and high hardness. The coating has better protection performance, insulation performance, and abrasion resistance than existing coatings such as parylene with the same thickness. It effectively solves the current problems of using coatings such as parylene, such as insufficient wear resistance of the coating, too thick thickness, low production efficiency, poor heat dissipation and signal blocking etc. The technical solutions adopted by the present invention are as follows:

A preparation method for a high-insulation hard nano-protective coating with a composite structure, comprising the following steps: (B1) a pre-treatment step; (B2) a step of forming a high-insulation coating with a composite structure; (B3) a step of surface hardening; and (B4) a post-treatment step.

(B1) Pre-treatment: A substrate is placed in a reaction chamber of a nano-coating preparation equipment, the reaction chamber is continuously vacuumized, the vacuum degree within the reaction chamber is adjusted to 10 to 200 mTorr, an inert gas He, Ar or a mixture of He and Ar is introduced, and a movement mechanism is turned on so that the substrate moves in the reaction chamber.

(B2) Preparation of a high-insulation coating with a composite structure: Monomer A vapor is introduced into the reaction chamber to achieve a vacuum degree of 30-300 mTorr, the plasma discharge is turned on for chemical vapor deposition, and a highly insulating nano-coating is prepared on the surface of the substrate via chemical vapor deposition. The introduction of monomer A vapor is stopped, monomer B vapor is introduced, and the plasma discharge is continued for chemical vapor deposition to prepare a organosilicon nano-coating on the surface of the high-insulation nano-coating so as to obtain a high-insulation nano-coating with a composite structure. The introduction of monomer B vapor is stopped.

The monomer A vapor includes: a mixture of at least one low dipole moment organic monomer and at least one polyfunctional unsaturated hydrocarbon or hydrocarbon derivative, and the mass fraction of the polyfunctional unsaturated hydrocarbon or hydrocarbon derivative in the monomer A vapor is 15-65%.

The monomer B vapor includes: a mixture of at least one organosilicon monomer containing a double bond, Si—Cl, Si—O—C, Si—N—Si, Si—O—Si structure or an annular structure and at least one polyfunctional unsaturated hydrocarbon or hydrocarbon derivative, and the mass fraction of the polyfunctional unsaturated hydrocarbon or hydrocarbon derivative in the monomer B vapor is 15-65%.

The monomer A vapor and monomer B vapor are atomized and volatilized through a feeding pump and is then introduced into the reaction chamber at a low pressure of 10-200 mTorr, and the flow rate of the introduced monomer A vapor and monomer B vapor is 10-1000 μL/min.

(B3) Surface hardening: Oxygen and/or water vapor is introduced at a flow rate of 10-100 μL/min, and oxygen and water vapor can be mixed at any ratio. The plasma discharge power is 50-100 W, the continuous discharge time is 60-180 s, and the surface of the high-insulation nano-coating is hardened.

(B4) Post-treatment: The introduction of oxygen and/or water vapor is stopped, and the plasma discharge is stopped at the same time. Vacuumizing is continued, and the vacuum degree of the reaction chamber is kept as 10-200 mTorr for 1-5 minutes. Air is introduced to the reaction chamber until the pressure thereof reaches an atmospheric pressure. The movement of the substrate is stopped and then the substrate is taken out.

Alternatively, the introduction of oxygen and/or water vapor is stopped and the plasma discharge is stopped at the same time. The reaction chamber is filled with air or an inert gas to a pressure of 2000-5000 mTorr, and then it is vacuumized to 10-200 mTorr. The above steps of inflating and vacuumizing are performed at least once. Air is introduced to the reaction chamber until the pressure thereof reaches an atmospheric pressure. The movement of the substrate is stopped, and then the substrate is taken out.

In a low-vacuum plasma discharge environment, more active free radicals can be formed through effective output of energy to enable chemical bond breaks in monomers with a more active molecular structure, and the free radicals and surface active groups of electronic products initiates polymerization by means of chemical bond bonding to form a nano film, and finally a high-insulation nano-coating is formed on the surface of the substrate.

In step (B1), the substrate is moved in the reaction chamber. The substrate is moved to reciprocate in a linear or a curve manner relative to the reaction chamber. The curved movement includes a circular movement, an elliptical movement, a planetary movement, a spherical or other movement in irregularly curved paths, etc.

In step (B1), the substrate is a solid material, and the solid material can be an electronic product, an electrical component, a semi-finished electronic assembly, a PCB board, a metal plate, a polytetrafluoroethylene sheet or an electronic component, and any interface of the surface of the substrate can be exposed to and used in water environment, mold environment, acid and alkaline solvent environment, acid and alkaline salt mist environment, acidic atmospheric environment, organic solvent immersion environment, cosmetics environment, sweat environment, cold and hot cycle impact environment or wet heat alternating environment after the preparation of the organosilicon nano-coating.

In step (B1), the reaction chamber is a rotating chamber or a cubic chamber with a volume of 50-1000 L, the temperature of the reaction chamber is controlled at 30-60° C., and the flow rate of the inert gas is 5-300 SCCM.

In step (B2): monomer A vapor or monomer B vapor is introduced, plasma discharge is performed for chemical vapor deposition, and the plasma discharge process during the deposition process includes low-power continuous discharge, pulse discharge or periodic alternating discharge.

In some embodiments, the plasma discharge process during the deposition process is a low-power continuous discharge, and specifically includes the following deposition processes for at least once.

The deposition process includes a pre-treatment stage and a coating stage. The plasma discharge power in the pre-treatment stage is 150-600 W, and the continuous discharge time is 60-450 s. Then, in the coating stage, the plasma discharge power is adjusted to 10-150 W and the continuous discharge time is 600-3600 s.

In some embodiments, the plasma discharge process during the deposition process is a pulse discharge, and specifically includes the following deposition processes for at least once.

The deposition process includes a pre-treatment stage and a coating stage. The plasma discharge power in the pre-treatment stage is 150-600 W, and the continuous discharge time is 60-450 s. Then, in the coating stage, a pulse discharge is performed, with the power of 10-300 W and time of 600 s to 3600 s. The pulse discharge frequency is 1-1000 HZ, and the duty cycle of the pulse is 1:1-1:500.

In some embodiments, the plasma discharge process during the deposition process is a periodic alternating discharge, and specifically includes the following deposition processes for at least once.

The deposition process includes a pre-treatment stage and a coating stage. The plasma discharge power in the pre-treatment stage is 150-600 W, and the continuous discharge time is 60-450 s. During the coating phase, the plasma is periodically alternating discharge output, with the power of 10-300 W, time of 600 s to 3600 s and AC frequency of 1-1000 Hz. The waveform of the plasma periodically alternating discharge output is a sawtooth waveform, sine waveform, square wave waveform, full-wave rectified waveform or half-wave rectified waveform.

The low dipole moment organic monomer includes: p-xylene, benzene, toluene, carbon tetrafluoride, α-methylstyrene, poly-p-xylylene, dimethylsiloxane, polydimethylsiloxane with a molecular weight of 500-50,000, allylbenzene, decafluorobiphenyl, decafluorobenzophenone, perfluoroallylbenzene, tetrafluoroethylene, hexafluoropropylene, perfluorooctylamine, iodoperfluorododecane, perfluorotributylamine, 1,8-diiodoperfluorooctane, tridecafluorohexyl iodide, nonafluorobutyl iodide, perfluorodecyl iodide, perfluorooctyl iodide, 1,4-bis(2',3'-epoxypropyl)perfluorobutane, perfluoro-2-methyl-2-pentene, 2-(perfluorobutyl) ethyl methacrylate, 2-(perfluorooctyl) ethyl methacrylate, 2-(perfluorooctyl) iodoethane, perfluorodecyl ethyl iodide, 1,1,2,2-tetrahydroperfluorohexyl iodide, perfluorobutyl ethylene, 1H,1H,2H-Perfluoro-1-decene, 2,4,6-tris(pentadecafluoroheptyl)-1,3,5-triazine, (perfluorohexyl)ethylene, 3-(Perfluoro-n-octyl)propenoxide, perfluoro-compound, (perfluorododecyl)ethylene, 1-Iodo-1H,1H,2H,2H-perfluorotetradecane, dibromo-p-xylene, and 1,1,4,4-tetraphenyl-1,3-butadiene.

The organosilicon monomer containing a double bond, Si—Cl, Si—O—C, Si—N—Si, Si—O—Si structure or an annular structure includes: Organosilicon monomers containing a double bond structure: allyltrimethoxysilane, vinyltriethoxysilane, vinyltrimethylsilane, 3-butenyltrimethylsilane, Vinyltris(methylethylketoxime)silane, tetramethyldivinyldisiloxane, and 1,2,2-trifluorovinyltriphenylsilane.

Organosilicon monomers containing a Si—Cl bond: triphenylchlorosilane, methylvinyldichlorosilane, trichloro(3,3,3-trifluoropropyl)silane, trifluoropropylmethyldichlorosilane, dimethylphenylchlorosilane, tributylchlorosilane, and benzyldimethylchlorosilane.

Organosilicon monomers containing a Si—O—C structure: tetramethoxysilane, trimethoxyhydrosiloxane, n-octyltriethoxysilane, phenyltriethoxysilane, vinyltris(2-methoxythoxy)silane, triethylvinylsilane, hexaethylcyclotrisiloxane, 3-(methacryloyloxy)propyltrimethoxysilane, phenyltris(trimethylsiloxy)silane, diphenyldiethoxysilane, dodecyltrimethoxysilane, n-octyltriethoxysilane, dimethoxysilane, and 3-chloropropyltrimethoxysilane.

Organosilicon monomers containing a Si—N—Si or Si—O—Si structure: hexamethyldisilazane, hexamethylcyclotrisilaneamino, hexamethyldisilazane and hexamethyl disiloxane.

Organosilicon monomers containing an annular structure: hexamethylcyclotrisiloxane, octamethylcyclotetrasiloxane, hexaphenylcyclotrisiloxane, decamethylcyclopentasiloxane, octaphenylcyclotetra siloxane, triphenylhydroxysilane, diphenyldihydroxysilane, bis(triphenylsilyl) ester, trifluoropropylmethylcyclotrisiloxane, 2,2,4,4-tetramethyl-6,6,8,8-tetraphenylcyclotetrasiloxane, tetramethyltetravinylcyclotetrasiloxane, (3-glycidyloxypropyl) triethoxysilane, and 3-glycidyloxypropyltrimethoxysilane.

The polyfunctional unsaturated hydrocarbons and hydrocarbon derivatives include: 1,3-butadiene, isoprene, 1,4-pentadiene, ethoxylated trimethylolpropane triacrylate, tripropylene glycol diacrylate, polyethylene glycol diacrylate, 1,6-hexanediol diacrylate, ethylene glycol diacrylate, diethylene glycol divinyl ether, or neopentyl glycol diacrylate.

In step (2), the plasma discharge mode is radio frequency discharge, microwave discharge, intermediate frequency discharge, high frequency discharge, electric spark discharge, and the waveforms of the high frequency discharge and intermediate frequency discharge are sinusoidal or bipolar pulses. RF plasma is a plasma generated by discharge of a high-frequency electromagnetic field. Microwave method uses microwave energy to excite the plasma, which has the advantage of high energy utilization efficiency. At the same time, because of electrodeless discharge, the plasma is pure. It is an excellent method for high-quality, high-speed and large-area preparation.

During the coating preparation process, the movement characteristics of the substrate and the plasma discharge energy are linked. At the time of the plasma discharge during the preparation process, the substrate moves, which improves the coating deposition efficiency and the uniformity and compactness of the coating thickness.

The prepared coating is insulative, waterproof and moisture proof, mildew resistant, acid and alkaline solvent resistant, acid and alkaline salt spray resistant, acidic atmosphere resistant, organic solvent immersion resistant, cosmetics resistant, sweat resistant, resistant to cold and heat cycle impact (e.g., −40° C. to +75° C.), resistant to humidity and heat change (e.g., 75%-95% of humidity) and has other characteristics. In addition to the above-mentioned protective properties, in case of a thickness of 1-1000 nm, the effect of the coating on the RF communication signals with frequency of 10M-8 G is less than 5%.

Compared with the prior art, the above technical solution of the present invention has the following advantages.

1. Plasma chemical vapor deposition technology method is more environmentally friendly than the liquid phase conformal coating method. Compared with the parylene evaporative deposition method, the deposition temperature is lower, the speed is faster, the coating structure and composition are strongly controllable, and the monomer selectivity is strong.

2. The substrate moves in the reaction chamber, making the thickness of the substrate coating in different positions tend to be the same, which solves the problem of uneven thickness of the surface coating of the substrate due to the different monomer density in different regions of the reaction chamber. During the preparation process, the movement characteristics of the substrate and the plasma discharge energy are linked. While the discharge energy is output, the substrate moves, which improves the deposition efficiency and significantly improves the compactness of the resulted protective coating. At the same time, due to the increased deposition efficiency, the amount of chemical monomer raw materials used for monomer vapor is only 10%-15% of that used in other existing technologies, thereby reducing emission of exhaust gas. It is more environmentally friendly and is of great significance in improving actual production efficiency.

3. In the present invention, low dipole moment and highly chemically inert organic monomers are filtered out, and the free volume and compactness of the coating are regulated via a polyfunctional monomer, so that the coating has high insulation performance, high hardness and excellent protection performance.

(1) In the present invention, a benzene ring of high symmetry and a benzene derivative or a perfluorinated compound thereof are selected as monomers. After polymerization, the molecule has low polarity due to symmetry or the fact that each carbon atom is covered by a large number of fluorine atoms. The dielectric constant is very low, less than 2.8, and the insulation is high.

(2) Because the benzene ring structure and fluorocarbon structure have high chemical inertness, the polymers formed by them have excellent chemical stability.

(3) The length and functionality of the molecular chain of the cross-linking agent can effectively improve the compactness and free volume of the coating, thereby improving insulation and protection performance.

(4) By introducing other monomers with cross-linked structure, controlling of the proportion of monomers and giving the equipment corresponding energy output and effective changes in process parameters according to the molecular bond energy, bond length difference and vaporization temperature difference of different monomers, a composite polymer nano-coating with graded structure is obtained such as a composite coating of a poly-p-xylene layer and a high-hardness organosilicon layer, which not only ensures the insulation of the film but also improves the environmental corrosion resistance and abrasion resistance of products such as electronic products and so on.

(5) Hardening adds a composite abrasion resistant silicon dioxide structure to the coating, effectively improving the hardness and abrasion resistance of the coating.

4. Compared with traditional monofunctional organic monomers, under plasma conditions, the functional groups connected to silicon in organosilicon monomer can undergo condensation reaction with each other so that a three-dimensional network crosslinking can occur among the monomers so as to further improve the compactness, wear resistance and corrosion resistance of the coating.

The traditional monofunctional carbon/hydrogen/oxygen organic compound monomer containing a double bond, Si—Cl, Si—O—C, Si—N—Si, Si—O—Si structure or an annular structure is used under plasma conditions. Because the functional groups connected to silicon have high reactivity, these organosilicon monomers have more cross-linkable active sites.

Since the functional group connected to silicon in the organosilicon monomer is liable to undergo hydrolysis or alcoholysis, the resulted structure is very easy to undergo condensation reaction and mutually cross-linking, and each silicon atom provides at least 1-4 active sites with high activity. Thus, it is easier to generate free radicals and undergo cross-linking reaction under low-temperature plasma conditions so as to form dense cross-linked compounds and improve protection performance. The coating thickness can be precisely controlled from nanometers to microns via the plasma deposition method, and it is not necessary to use a solvent. The present invention also prevents defects such as waste water, waste liquid and waste gas produced by liquid phase organosilicon coating method.

5. During the surface hardening process, some oxygen is introduced into the monomer, so that the oxygen reacts with the organosilicon monomer. When the oxygen completely replaces the carbon on the silicon atom, the organic silicon can be oxidized to nano-silica. When water vapor is introduced into the monomer, it can be hydrolyzed with organic silicon to produce nano-silica. The mass percentage of the obtained nano-silica is about 5%-20%; since silica is an atomic crystal, the hardness is as high as 1500 HV. It is dispersed in the coating so that the hardness of the coating can be greatly improved due to the dispersion strengthening effect. The organic coating obtained by plasma deposition usually has a hardness of HB-2H. When the mass percentage of silica in the coating is 5%, the hardness of the coating can be increased to H-3H. When the mass percentage of silica in the coating is 20%, coating hardness can be increased to 2H-4H.

Electronic equipment in daily life is easily damaged by the corrosion of the corrosive environment and is basically in the corrosive environment during the use process. After a long time, it will cause irreparable damage to electronic equipment such as short circuits and open circuits, etc. The coating method of the present invention greatly improves the great significance of nanometer in improving the actual production efficiency. It improves the service life of the coating in corrosive environment and the protection effect of the product. It is mainly used in the following products.

(1) Portable device keyboard: The portable keyboard is small and light, and is often used in computers, mobile phones and other devices. It is convenient for users to work during trip. However, when it encounters contamination of common liquids, such as the accidental overturning of the tea cup, the infiltration of rain and sweat, the keyboard is easily short-circuited and then damaged. After the keyboard is coated with this type of nano-coating, it can ensure that the keyboard surface is easy to clean, and the function is intact after contact with water, so that the keyboard can adapt to more severe environment.

(2) LED display: LED display is used for product promotion, store decoration, lighting, warning and other purposes. Some of its applications are in harsh environment of rain or dust. In rainy days, the outdoor LED advertising screens in shopping malls, road warning lights and LED display control panels in production workshops, etc. are easy to fail, and dust is easy to be accumulated and it is difficult to clean. After application of this nano-coating, the above problems can be effectively solved.

(3) Intelligent fingerprint lock: Fingerprint lock is a smart lock, which integrates computer information technology, electronic technology, mechanical technology and modern hardware technology, and is widely used in the public security criminal investigation and judicial fields. However, its internal circuit is easily short-circuited in case of water, it is difficult to repair and requires violent unlocking. This problem can be avoided after using this coating.

(4) Hearing aids and Bluetooth headsets: There are no communication cables for hearing aids or Bluetooth headsets. After this coating is applied, users can use such products in a water environment for a certain period of time, such as bathing, rainy days, and the devices will not be damaged due to rain water.

(5) Sensors: Some sensors need to work in a liquid environment, such as water pressure and oil pressure sensors, sensors used in underwater operating equipment and sensors that often encounter water in the working environment. These sensors will not fail due to the invading of liquid into the internal structure of the mechanical equipment after this coating is applied.

(6) 3C products: such as mobile phones, notebooks, PSP, etc.

(7) Other equipment that needs to be waterproof: It includes equipment that needs to work in a humid environment, or that may encounter accidents such as common liquid spill, which will affect the normal operation of the internal weak current lines.

The high-insulation hard coating with a composite structure prepared by this method can also be applied to the following different environments and related products involved:

Waterproof, moisture-proof and mold-proof: such as (1) house interior parts: bathroom ceiling, wallpaper, chandeliers, curtains and window screens; (2) daily necessities: mosquito nets, lampshades, chopstick baskets and car rear-view mirrors; (3) cultural relics and artworks: copybooks, antiques, wood carvings, leather, bronzes, silk, costumes and ancient books; (4) electronic components and electronic products: sensors (operating in wet or dusty environment), chips of various electronic products (electronic blood pressure monitors and smart watches), circuit boards, mobile phones, LED screens and hearing aids; and (5) precision instruments and optical equipment: mechanical watches and microscopes.

Resistance to acid and alkaline solvents, acid and alkaline salt spray and acidic atmosphere: (1) housing interior parts: wallpaper and tiles; (2) protective equipment: acid-resistant (alkali) gloves and acid-resistant (alkali) protective clothing; (3) mechanical equipment and pipelines: flue gas desulfurization equipment, seals (acid/alkaline lubricating oil), pipelines, valves, large-diameter marine transmission pipeline linings, etc.; (4) various reaction kettles and reactors; (5) chemical production and storage; sewage treatment and aeration tanks; and (6) others: acid-alkali workshops, alkali-proof aerospace, energy and power, steel metallurgy, petrochemicals, medical and other industries, storage containers, statues (reducing corrosion of acid rain on them) and sensors (in acid/alkaline environment).

Resistant to organic solvents, cosmetics and sweat: such as (1) paraffins, olefins, alcohols, aldehydes, amines, esters, ethers, ketones, aromatic hydrocarbons, hydrogenated hydrocarbons, terpen hydrocarbons, halogenated hydrocarbons, heterocyclic compounds, solvents containing nitrogen compounds and sulfur compounds; (2) cosmetics packaging container; and (3) fingerprint locks and earphones.

Resistance to cold and heat cycle impact (e.g., −40° C. to +100° C.) and resistance to humidity and heat alternating (e.g., humidity: 75%-95%): electrical, electronic and automotive electrical appliances, such as equipment in the fields of aviation, automotive, home appliances, scientific research and so on.

The present invention is described in detail below with reference to specific embodiments, but the present invention is not limited to the specific embodiments.

Embodiment B1

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 10 mTorr, an inert gas Ar is introduced, and a movement mechanism is turned on so that the substrate moves in the reaction chamber.

In step (1), the substrate is a solid material, and the solid material can be a block aluminum material and a PCB board, and any interface of the substrate may be exposed to a humid heat test environment after a cold and heat cycle impact resistance coating is prepared.

In step (1), the reaction chamber is a rotating chamber with a volume 50 L, the temperature of the reaction chamber is controlled at 30° C., and the flow rate of the inert gas is 5 SCCM.

In step (1), the substrate moves in the reaction chamber, and the substrate can be moved in a circular manner relative to the reaction chamber at a speed of 10 rpm.

(2) Preparation of a high-insulation coating with a composite structure: Monomer A vapor is introduced into the reaction chamber to achieve a vacuum degree of 30 mTorr, plasma discharge is turned on for chemical vapor deposition, and a highly insulating nano-coating is prepared on the surface of the substrate via chemical vapor deposition. The introduction of monomer A vapor is stopped, monomer B vapor is introduced, and plasma discharge is continued for chemical vapor deposition to prepare a organosilicon nano-coating on the surface of the high-insulation nano-coating so as to obtain a high-insulation nano-coating with a composite structure. The introduction of monomer B vapor is stopped.

The monomer A vapor composition comprises: a mixture of one low dipole moment organic monomer and three polyfunctional unsaturated hydrocarbons and hydrocarbon derivatives, and the mass fraction of the polyfunctional unsaturated hydrocarbons or hydrocarbon derivatives in the monomer A vapor is 15%.

The low dipole moment organic monomer is: perfluoro-allylbenzene,

The three polyfunctional unsaturated hydrocarbons and hydrocarbon derivatives are: 1,4-pentadiene, tripropylene glycol diacrylate and 1,6-hexanediol diacrylate.

The monomer B vapor includes: a mixture of three organosilicon monomers containing a double bond structure and one polyfunctional unsaturated hydrocarbon or hydrocarbon derivative, and the mass fraction of the polyfunctional unsaturated hydrocarbon or hydrocarbon derivative in the monomer B vapor is 65%.

The three organosilicon monomers containing a double bond structure is: vinyltriethoxysilane, 3-butenyltrimethyl-silane and vinyltris(methylethylketoxime)silane.

The mixture of one polyfunctional unsaturated hydrocarbon and hydrocarbon derivative is: ethoxylated trimethyl-olpropane triacrylate.

The monomer A vapor and monomer B vapor are atomized and volatilized through a feeding pump and is then introduced into the reaction chamber at a low pressure of 10 mTorr, and the flow rate of the introduced monomer A vapor and monomer B vapor is 10 μL/min.

In step (2), monomer A vapor or monomer B vapor is introduced, and a plasma discharge process is performed for chemical vapor deposition. The plasma discharge process during the deposition process is a low-power continuous discharge, and specifically includes the following deposition processes for once.

The deposition process includes a pre-treatment stage and a coating stage. The plasma discharge power in the pre-treatment stage is 150 W, and the continuous discharge time is 450 s. Then, in the coating stage, and the plasma discharge power is adjusted to 10 W and the continuous discharge time is 3600 s.

The plasma discharge in the step (2) can be a radio frequency discharge.

(3) Surface hardening: Oxygen is introduced at a flow rate of 10 μL/min, the plasma discharge power is 50 W, the continuous discharge time is 180 s, and the surface of the high-insulation nano-coating is hardened.

(4) Post-treatment: Introduction of oxygen is stopped, the plasma discharge is stopped at the same time, vacuumizing is continued, the vacuum degree of the reaction chamber is kept to 10 mTorr for 1 min, then air is introduced to an atmospheric pressure, and then the substrate is taken out.

The dielectric constant of the coating obtained by the above process is 2.73, and the hardness is 2H. The aluminum material and PCB board after coating are tested by a cold and heat cycle impact test, and the results are as follows:

| Test substrate | Experimental conditions | Times of cycle | Experiment time | Result detection |
|---|---|---|---|---|
| Aluminum material | −40° C.~+75° C. | 25 | 2 h | Good appearance without affecting performance |
| PCB board | −40° C.~+75° C. | 25 | 2 h | Good appearance without affecting performance |

The effects of the humid heat alternating test of the above-mentioned coated aluminum materials are as follows:

| Experimental conditions | Temperature | | 55° C. | | | |
|---|---|---|---|---|---|---|
| | Humidity | 75% | 80% | 85% | 90% | 95% |
| Aluminum material | Time 12 h | Pass | Pass | Pass | Pass | Pass |
| | Time 24 h | Pass | Pass | Pass | Pass | Pass |
| | Time 36 h | Pass | Pass | Pass | Pass | Pass |
| | Time 48 h | Pass | Pass | Pass | Pass | Pass |

Embodiment B2

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 30 mTorr, an inert gas He is introduced, and a movement mechanism is turned on so that the substrate moves.

In step (1), the substrate is a solid material, and the solid material can be a block of aluminum material. Any interface of the substrate after the humid heat-resistant alternating coating is prepared may be exposed to a humid heat test environment.

In step (1), the reaction chamber is a cubic chamber with a volume 280 L, the temperature of the reaction chamber is controlled at 42° C., and the flow rate of the inert gas is 19 SCCM.

In step (1), the substrate performs planetary movement at a revolution speed of 12 rpm and a rotation speed of 8 rpm.

(2) Preparation of a high-insulation coating with a composite structure:

Monomer A vapor is introduced into the reaction chamber to achieve a vacuum degree of 70 mTorr, plasma discharge is turned on for chemical vapor deposition, and a high-insulation nano-coating is prepared on the surface of the substrate via chemical vapor deposition. The introduction of monomer A vapor is stopped, monomer B vapor is introduced, and the plasma discharge is continued for chemical vapor deposition to prepare an organosilicon nano-coating on the surface of the high-insulation nano-coating so as to obtain a high-insulation nano-coating with a composite structure. The introduction of monomer B vapor is stopped.

The monomer A vapor includes: a mixture of five low dipole moment organic monomers and one polyfunctional unsaturated hydrocarbon or hydrocarbon derivative, and the mass fraction of the polyfunctional unsaturated hydrocarbon or hydrocarbon derivative in the monomer A vapor is 65%.

The five low-dipole moment organic monomers are: allylbenzene, decafluorobenzophenone, tetrafluoroethylene, perfluorooctylamine, and iodoperfluorododecane.

The one polyfunctional unsaturated hydrocarbon and hydrocarbon derivative is: tripropylene glycol diacrylate.

The monomer B vapor includes: a mixture of one organosilicon monomer containing a Si—Cl structure and three polyfunctional unsaturated hydrocarbons or hydrocarbon derivatives, and the mass fraction of the polyfunctional unsaturated hydrocarbons or hydrocarbon derivatives in the monomer B vapor is 15%.

The one organosilicon monomer containing a Si—Cl structure can be trifluoropropylmethyldichlorosilane.

The mixture of the three polyfunctional unsaturated hydrocarbons or hydrocarbon derivatives is: isoprene, tripropylene glycol diacrylate and polyethylene glycol diacrylate.

The monomer A vapor and monomer B vapor are atomized and volatilized through a feeding pump and is then introduced into the reaction chamber at a low pressure of 30 mTorr, and the flow rate of the introduced monomer A vapor and monomer B vapor is 150 μL/min.

In step (2), monomer A vapor or monomer B vapor is introduced, a plasma discharge process is performed for chemical vapor deposition. The plasma discharge process during the deposition process is a low-power continuous discharge, and specifically includes the following deposition processes for six times.

The deposition process includes a pre-treatment stage and a coating stage. The plasma discharge power in the pre-treatment stage is 600 W, and the continuous discharge time is 60 s. Then, in the coating stage, and the plasma discharge power is adjusted to 150 W and the continuous discharge time is 600 s.

The plasma discharge in step (2) can be a microwave discharge.

(3) Surface hardening: Water vapor is introduced at a flow rate of 30 μL/min, the plasma discharge power is 70 W, the continuous discharge time is 80 s, and the surface of the high-insulation nano-coating is hardened.

(4) Post-treatment: Introduction of water vapor is stopped, the plasma discharge is stopped at the same time. Vacuumizing is continued, and the vacuum degree of the reaction chamber is kept as 60 mTorr for 2 minutes. Air is introduced to the reaction chamber until the pressure thereof reaches an atmospheric pressure, and then the substrate is taken out.

The dielectric constant of the coating obtained by the above process is 2.45, the hardness is 3H, and the aluminum material after coating is tested by a cold and heat cycle impact test and the results are as follows:

| Test substrate | Experimental conditions | Times of cycle | Experiment time | Result detection |
| --- | --- | --- | --- | --- |
| Aluminum substrate | −40° C.~+75° C. | 25 | 2 h | Good appearance without affecting performance |

The effects of the humid heat alternating test of the above-mentioned coated aluminum materials are as follows:

| Experimental conditions | Temperature | | 55° C. | | | |
| --- | --- | --- | --- | --- | --- | --- |
| | Humidity | 75% | 80% | 85% | 90% | 95% |
| Aluminum material | Time 12 h | Pass | Pass | Pass | Pass | Pass |
| | Time 24 h | Pass | Pass | Pass | Pass | Pass |
| | Time 36 h | Pass | Pass | Pass | Pass | Pass |
| | Time 48 h | Pass | Pass | Pass | Pass | Pass |

Embodiment B3

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 80 mTorr, a mixture of inert gas Ar and He is introduced, and a movement mechanism is turned on so that the substrate is moved.

In step (1), the substrate is a solid material, and the solid material can be a block polytetrafluoroethylene plate and an electrical component. Any interface of the block polytetrafluoroethylene plate can be exposed to and used in the GJB150.10A-2009 mold test environment after a mold-proof coating is prepared on the surface. Any interface of the electrical component can be exposed to and used in the environment described in the international industrial waterproof grade standard IPX7 after a waterproof and electrical breakdown resistant coating is prepared on the surface.

In step (1), the reaction chamber is a rotating chamber with a volume 430 L, the temperature of the reaction chamber is controlled at 46° C., and the flow rate of the inert gas is 54 SCCM.

In step (1), the substrate can be moved to perform a circular movement at a speed of 15 rpm.

(2) Preparation of a high-insulation coating with a composite structure: Monomer A vapor is introduced into the reaction chamber to achieve a vacuum degree of 120 mTorr, plasma discharge is turned on for chemical vapor deposition, and a highly insulating nano-coating is prepared on the surface of the substrate via chemical vapor deposition. The introduction of monomer A vapor is stopped, monomer B vapor is introduced, and the plasma discharge is continued for chemical vapor deposition to prepare an organosilicon nano-coating on the surface of the high-insulation nano-coating so as to obtain a high-insulation nano-coating with a composite structure, and the introduction of monomer B vapor is stopped.

The monomer A vapor includes: a mixture of four low dipole moment organic monomers and three polyfunctional unsaturated hydrocarbons and hydrocarbon derivatives, and the mass fraction of the polyfunctional unsaturated hydrocarbons or hydrocarbon derivatives in the monomer A vapor is 57%.

The four low-dipole moment organic monomers are: toluene, decafluorobenzophenone, 1,4-bis(2',3'-epoxypropyl)perfluorobutane, and 2-(perfluorobutyl) ethyl methacrylate.

The three polyfunctional unsaturated hydrocarbons and hydrocarbon derivatives are: 1,3-butadiene, 1,4-pentadiene, and polyethylene glycol diacrylate.

The monomer B vapor includes: a mixture of three organosilicon monomers containing a Si—O—C structure and two polyfunctional unsaturated hydrocarbons or hydrocarbon derivatives, and the mass fraction of the polyfunctional unsaturated hydrocarbons or hydrocarbon derivatives in the monomer B vapor is 55%.

The three organosilicon monomers containing a Si—O—C structure are: tetramethoxysilane, vinyltris(2-methoxythoxy)silane, and 3-(methacryloyloxy)propyltrimethoxysilane.

The mixture of the two polyfunctional unsaturated hydrocarbons or hydrocarbon derivatives is: isoprene and 1,6-hexanediol diacrylate. The monomer A vapor and monomer B vapor are atomized and volatilized through a feeding pump and is then introduced into the reaction chamber at a low pressure of 80 mTorr, and the flow rate of the introduced monomer A vapor and monomer B vapor is 360 μL/min.

In step (2), monomer A vapor or monomer B vapor is introduced, a plasma discharge process is performed for chemical vapor deposition. The plasma discharge process during the deposition process is a pulse discharge, and specifically includes the following deposition processes for once.

The deposition process includes a pre-treatment stage and a coating stage. The plasma discharge power in the pre-treatment stage is 150 W, and the continuous discharge time is 450 s. Then, in the coating stage, a pulse discharge is performed, with the power of 10 W and time of 3600 s. The pulse discharge frequency is 1 HZ, and the duty cycle of the pulse is 1:500.

The plasma discharge in step (2) can be an electric spark discharge.

(3) Surface hardening: Oxygen and water vapor are introduced at a flow rate of 50 μL/min, the plasma discharge power is 80 W, the continuous discharge time is 100 s, and the surface of the high-insulation nano-coating is hardened.

(4) Post-treatment: Introduction of oxygen and water vapor is stopped, plasma discharge is stopped at the same time, vacuumizing is continued, and the vacuum degree of the reaction chamber is kept to 100 mTorr for 3 minutes. Air is introduced to the reaction chamber until the pressure thereof reaches an atmospheric pressure, and then the substrate is taken out.

The dielectric constant of the coating obtained by the above process is 2.46, the hardness is 2H, and the PTFE board after coating is subjected to GJB150.10A-2009 mold tests and the results are as follows:

| PTFE board-performance test | |
| --- | --- |
| Water contact angle | 121° |
| Oil contact angle | 95° |
| Mold resistance grade | Grade 2 |
| Degree of surface mold spots | 6% |

Test results of an underwater immersion test for the prepared electrical component with the prepared waterproof and electrical breakdown resistant coating under different voltages are as follows:

| Resistance to underwater electricity | | | |
| --- | --- | --- | --- |
| | Time to reach 1 mA at a certain voltage | | |
| | 3.8 V | 5 V | 12.5 V |
| Embodiment B3 | >96 h | >96 h | >96 h |

The results of IPX7 waterproof rating test (1-meter underwater immersion test for 30 minutes) are as follows:

| IPX7 waterproof grade test | |
| --- | --- |
| Embodiment B3 | Electrical components work properly. |

Embodiment B4

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 100 mTorr, an inert gas Ar is introduced, and a movement mechanism is turned on so that the substrate moves.

In step (1), the substrate is a solid material, and the solid material can be a block polytetrafluoroethylene plate and an electrical component. Any interface of the block polytetrafluoroethylene plate can be exposed to and used in the GJB150.10A-2009 mold test environment after a mold-proof coating is prepared on the surface. Any interface of the electrical component can be exposed to and used in the environment described in the international industrial waterproof grade standard IPX7 after a waterproof and electrical breakdown resistant coating is prepared on the surface.

In step (1), the volume of the reaction chamber is 780 L, the temperature of the reaction chamber is controlled at 53° C., and the flow rate of the inert gas is 180 SCCM.

In step (1), the substrate can be moved to linearly reciprocate at a movement speed of 40 mm/min.

(2) Preparation of a high-insulation coating with a composite structure: Monomer A vapor is introduced into the reaction chamber to achieve a vacuum degree of 180 mTorr, plasma discharge is turned on for chemical vapor deposition, and a high-insulation nano-coating is prepared on the surface of the substrate via chemical vapor deposition. The introduction of monomer A vapor is stopped, monomer B vapor is introduced, and the plasma discharge is continued for chemical vapor deposition to prepare a organosilicon nano-coating on the surface of the high-insulation nano-coating so as to obtain a high-insulation nano-coating with a composite structure, and the introduction of monomer B vapor is stopped.

The monomer A vapor includes: a mixture of six low dipole moment organic monomers and four polyfunctional unsaturated hydrocarbons and hydrocarbon derivatives, and the mass fraction of the polyfunctional unsaturated hydrocarbons or hydrocarbon derivatives in the monomer A vapor is 42%.

The six low-dipole moment organic monomers are: 3-(Perfluoro-n-octyl)propenoxide, perfluoro-compound, (perfluorododecyl)ethylene, 1-Iodo-1H,1H,2H,2H-perfluorotetradecane, dibromo-p-xylene, and 1,1,4,4-tetraphenyl-1,3-butadiene.

The four polyfunctional unsaturated hydrocarbons and hydrocarbon derivatives are: 1,3-butadiene, 1,4-pentadiene, 1,6-hexanediol diacrylate, and ethylene glycol diacrylate.

The monomer B vapor includes: a mixture of four organosilicon monomers containing an annular structure and two polyfunctional unsaturated hydrocarbons or hydrocarbon derivatives, and the mass fraction of the polyfunctional unsaturated hydrocarbons or hydrocarbon derivatives in the monomer B vapor is 36%.

The four organosilicon monomers containing an annular structure are: bis(triphenylsilyl) ester, trifluoropropylmethylcyclotrisiloxane, 2,2,4,4-tetramethyl-6,6,8,8-tetraphenyl-cyclotetrasiloxane, and tetramethyltetravinylcyclotetrasiloxane.

The mixture of the two polyfunctional unsaturated hydrocarbons and hydrocarbon derivatives is: 1,4-pentadiene, and ethoxylated trimethylolpropane triacrylate.

The monomer A vapor and monomer B vapor are atomized and volatilized through a feeding pump and is then introduced into the reaction chamber at a low pressure of 100 mTorr, and the flow rate of the introduced monomer A vapor and monomer B vapor is 580 µL/min.

In step (2), monomer A vapor or monomer B vapor is introduced, a plasma discharge process is performed for chemical vapor deposition. The plasma discharge process during the deposition process is a pulse discharge, and specifically includes the following deposition processes for five times.

The deposition process includes a pre-treatment stage and a coating stage. The plasma discharge power in the pre-treatment stage is 600 W, and the continuous discharge time is 60 s. Then, in the coating stage, a pulse discharge is performed, with the power of 300 W and time of 600 s. The pulse discharge frequency is 1000 HZ, and the duty cycle of the pulse is 1:1.

The plasma discharge in step (2) can be a high-frequency discharge, and the waveform of the high-frequency discharge is sinusoidal.

(3) Surface hardening: Oxygen and water vapor are introduced at a flow rate of 80 µL/min, the plasma discharge power is 90 W, the continuous discharge time is 90 s, and the surface of the high-insulation nano-coating is hardened.

(4) Post-treatment: Introduction of oxygen and water vapor is stopped, and the plasma discharge is stopped at the same time. Vacuumizing is continued, and the vacuum degree of the reaction chamber is kept as 200 mTorr for 4 minutes. Compressed air is introduced to the reaction chamber until the pressure thereof reaches an atmospheric pressure, and then the substrate is taken out.

The dielectric constant of the coating obtained by the above process is 2.48, and the hardness is 2H. The PTFE board after coating is subjected to GJB150.10A-2009 mold test and the results are as follows:

| PTFE board-performance test | |
| --- | --- |
| Water contact angle | 126° |
| Oil contact angle | 98° |
| Mold resistance grade | Grade 2 |

-continued

| PTFE board-performance test | |
|---|---|
| Degree of surface mold spots | 7% |

Test results of underwater immersion test for the prepared electrical component with the prepared waterproof and electrical breakdown resistant coating under different voltages:

| Resistance to underwater electricity | | | |
|---|---|---|---|
| | Time to reach 1 mA at a certain voltage | | |
| | 3.8 V | 5 V | 12.5 V |
| Embodiment B4 | >96 h | >96 h | >96 h |

The result of IPX7 waterproof rating tests (1-meter underwater immersion test for 30 minutes) are as follows:

| IPX7 waterproof grade test | |
|---|---|
| Embodiment B4 | Electrical components work properly. |

Embodiment B5

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 200 mTorr, a mixture of inert gas Ar and He is introduced, and a movement mechanism is turned on so that the substrate is moved.

In step (1), the substrate is a solid material, and the solid material can be a block aluminum material, and any interface of the substrate may be exposed to an acid and alkaline test environment after an acid and alkaline resistant coating is prepared.

In step (1), the volume of the reaction chamber is 1000 L, the temperature of the reaction chamber is controlled at 60° C., and the flow rate of the inert gas is 300 SCCM.

In step (1), the substrate is moved to reciprocate in a curve manner at a speed of 60 mm/min.

(2) Preparation of a high-insulation coating with a composite structure: Monomer A vapor is introduced into the reaction chamber to achieve a vacuum degree of 300 mTorr, plasma discharge is turned on for chemical vapor deposition, and a high-insulation nano-coating is prepared on the surface of the substrate via chemical vapor deposition. The introduction of monomer A vapor is stopped, monomer B vapor is introduced, and the plasma discharge is continued for chemical vapor deposition to prepare an organosilicon nano-coating on the surface of the high-insulation nano-coating so as to obtain a high-insulation nano-coating with a composite structure, and the introduction of monomer B vapor is stopped.

The monomer A vapor includes: a mixture of three low dipole moment organic monomers and three polyfunctional unsaturated hydrocarbons and hydrocarbon derivatives, and the mass fraction of the polyfunctional unsaturated hydrocarbons or hydrocarbon derivatives in the monomer A vapor is 27%. The three low-dipole moment organic monomers are: perfluorotributylamine, perfluoroiododecane, perfluorodecyl iodide and perfluorooctyl iodide.

The three polyfunctional unsaturated hydrocarbons and hydrocarbon derivatives are: 1,3-butadiene, 1,6-hexanediol diacrylate, and ethylene glycol diacrylate.

The monomer B vapor includes: a mixture of two organosilicon monomers containing Si—N—Si or Si—O—Si structure and two polyfunctional unsaturated hydrocarbons or hydrocarbon derivatives, and the mass fraction of the polyfunctional unsaturated hydrocarbons or hydrocarbon derivatives in the monomer B vapor is 23%.

The two organosilicon monomers containing a Si—N—Si or Si—O—Si structure are: hexamethylcyclotrisilaneamino, and hexamethyldisilazane. The mixture of the two polyfunctional unsaturated hydrocarbons and hydrocarbon derivatives includes: diethylene glycol divinyl ether and neopentyl glycol diacrylate.

The monomer A vapor and monomer B vapor are atomized and volatilized through a feeding pump and is then introduced into the reaction chamber at a low pressure of 200 mTorr, and the flow rate of the introduced monomer A vapor and monomer B vapor is 1000 μL/min.

In step (2), monomer A vapor or monomer B vapor is introduced, a plasma discharge process is performed for chemical vapor deposition. The plasma discharge process during the deposition process is a periodic alternating discharge, and specifically includes the following deposition processes for once.

The deposition process includes a pre-treatment stage and a coating stage. The plasma discharge power in the pre-treatment stage is 150 W, and the continuous discharge time is 450 s. During the coating phase, the plasma is periodically alternating discharge output, with the power of 10 W, time of 3600 s and AC frequency of 1 Hz. The waveform of the plasma periodically alternating discharge output is a saw-tooth waveform.

The plasma discharge mode in step (2) can be an intermediate-frequency discharge, and the waveform of the intermediate-frequency discharge is a bipolar pulse.

(3) Surface hardening: Oxygen is introduced at a flow rate of 100 μL/min, the plasma discharge power is 100 W, the continuous discharge time is 60 ss, and the surface of the high-insulation nano-coating is hardened.

(4) Post-treatment: The introduction of oxygen is stopped and the plasma discharge is stopped at the same time. The reaction chamber is filled with an inert gas to a pressure of 2000 mTorr, and then it is vacuumized to 10 mTorr. The above steps of inflating and vacuumizing are performed once. Air is introduced to the reaction chamber until the pressure thereof reaches an atmospheric pressure. The movement of the substrate is stopped, and then the substrate is taken out.

The hardness of the coating obtained by the above process and the coated aluminum material is 4H. The test results are as follows:

| | Performance | | | |
|---|---|---|---|---|
| | Water contact angle | Oil contact angle | Adhesion | Dielectric constant |
| Embodiment B5 | 125° | 84° | Low adhesion and water droplets are easy to slide. | 2.57 |

Test results of resistance to organic solvents ("pass" means that the contact angle change is less than 5° after immersion for a period of time) are as follows.

| Substrate | Chemical reagent | Time | | | |
|---|---|---|---|---|---|
| | | 48 h | 96 h | 144 h | 192 h |
| Aluminum sheet | Acetone | pass | pass | pass | pass |
| | Cyclohexane | pass | pass | pass | pass |
| | Petroleum ether | pass | pass | pass | pass |
| | Xylene | pass | pass | pass | pass |
| | n-propanol | pass | Pass | pass | pass |

Acid and alkali test results ("pass" means that no corrosion occurs after experiment for a period of time) are as follows.

| Substrate | Acid and alkaline reagent | Time | | | |
|---|---|---|---|---|---|
| | | 48 h | 96 h | 144 h | 192 h |
| Aluminum sheet | Acid salt spray | pass | pass | pass | pass |
| | Neutral salt spray | pass | pass | pass | pass |
| | Alkaline salt spray | pass | pass | pass | pass |
| | 5% acetic acid solution | pass | pass | pass | pass |
| | 5% NaOH solution | pass | pass | pass | pass |

Embodiment B6

A preparation method for a high-insulation hard nano-protective coating with a composite structure, comprising the following steps: (1) a pre-treatment step; (2) a step of forming a high-insulation coating with a composite structure; (3) a step of surface hardening; and (4) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 140 mTorr, an inert gas Ar is introduced, and a movement mechanism is turned on so that the substrate moves.

In step (1), the substrate is a solid material, and the solid material is a block of aluminum material and an electrical component, and any interface of the substrate may be exposed to an organic solvent test environment after a high-insulation coating is prepared on its surface.

In step (1), the volume of the reaction chamber is 450 L, the temperature of the reaction chamber is controlled at 47° C., and the flow rate of the inert gas is 150 SCCM.

In step (1), the substrate is moved to reciprocate in a curve manner at a speed of 60 mm/min.

(2) Preparation of a high-insulation coating with a composite structure: Monomer A vapor is introduced into the reaction chamber to achieve a vacuum degree of 220 mTorr, plasma discharge is turned on for chemical vapor deposition, and a highly insulating nano-coating is prepared on the surface of the substrate via chemical vapor deposition. The introduction of monomer A vapor is stopped, monomer B vapor is introduced, and the plasma discharge is continued for chemical vapor deposition to prepare a organosilicon nano-coating on the surface of the high-insulation nano-coating so as to obtain a high-insulation nano-coating with a composite structure. The introduction of monomer B vapor is stopped.

The monomer A vapor composition includes: a mixture of seven low dipole moment organic monomers and three polyfunctional unsaturated hydrocarbons and hydrocarbon derivatives, and the mass fraction of the polyfunctional unsaturated hydrocarbons or hydrocarbon derivatives in the monomer A vapor is 23%.

The seven low-dipole moment organic monomers are: tetrafluoroethylene, perfluorooctylamine, iodoperfluorododecane, perfluorobutyl iodide, 1,4-bis(2',3'-epoxypropyl) perfluorobutane, perfluoro-2-methyl-2-pentene, and 2-(perfluorobutyl) ethyl methacrylate.

The three polyfunctional unsaturated hydrocarbons and hydrocarbon derivatives are: 1,4-pentadiene, ethoxylated trimethylolpropane triacrylate, and ethylene glycol diacrylate.

The monomer B vapor includes: a mixture of four organosilicon monomers containing a Si—O—C structure and three polyfunctional unsaturated hydrocarbons or hydrocarbon derivatives, and the mass fraction of the polyfunctional unsaturated hydrocarbons or hydrocarbon derivatives in the monomer B vapor is 38%.

The four organosilicon monomers containing a Si—O—C structure are: diphenyldiethoxysilane, dodecyltrimethoxysilane, n-octyltriethoxysilane, and dimethoxysilane.

The mixture of the three polyfunctional unsaturated hydrocarbons and hydrocarbon derivatives includes: isoprene, 1,4-pentadiene, diethylene glycol divinyl ether and neopentyl glycol diacrylate.

The monomer A vapor and monomer B vapor are atomized and volatilized through a feeding pump and is then introduced into the reaction chamber at a low pressure of 140 mTorr, and the flow rate of the introduced monomer A vapor and monomer B vapor is 800 μL/min.

In step (2), monomer A vapor or monomer B vapor is introduced, a plasma discharge process is performed for chemical vapor deposition. The plasma discharge process during the deposition process is a periodic alternating discharge, and specifically includes the following deposition processes for five times.

The deposition process includes a pre-treatment stage and a coating stage. The plasma discharge power in the pre-treatment stage is 600 W, and the continuous discharge time is 60 s. During the coating phase, the plasma is periodically alternating discharge output, with the power of 300 W, time of 600 s and AC frequency of 1000 Hz. The waveform of the plasma periodically alternating discharge output is a half-wave rectified waveform.

The plasma discharge in step (2) can be a microwave discharge.

(3) Surface hardening:

Water vapor is introduced at a flow rate of 70 μL/min, the plasma discharge power is 75 W, the continuous discharge time is 125 s, and the surface of the high-insulation nano-coating is hardened.

(4) Post-treatment: The introduction of water vapor is stopped and the plasma discharge is stopped at the same time, the reaction chamber is filled with air to a pressure of 5000 mTorr, and then it is vacuumized to 200 mTorr. The above steps of inflating and vacuumizing are performed for six times. Air is introduced to the reaction chamber until the pressure thereof reaches an atmospheric pressure. The movement of the substrate is stopped, and then the substrate is taken out. The hardness of the coated aluminum material is 3H, and other performance test results are as follows.

(1) Hydrophobicity and oleophobicity

| | Performance | | | |
|---|---|---|---|---|
| | Water contact angle | Oil contact angle | Adhesion | Dielectric constant |
| Embodiment B6 | 120° | 80° | Low adhesion and water droplets are easy to slide. | 2.46 |

(2) The results of the underwater immersion test of the coated electrical components under different voltages are as follows:

| | Resistance to underwater electricity | | |
|---|---|---|---|
| | Time to reach 1 mA at a certain voltage | | |
| | 3.8 V | 5 V | 12.5 V |
| Embodiment 6 | >120 h | >120 h | >120 h |

(3) Test results of resistance to organic solvents ("pass" means that the contact angle change is less than 5° after immersion for a period of time) are as follows.

| | Chemical | Time | | | |
|---|---|---|---|---|---|
| Substrate | reagent | 48 h | 96 h | 144 h | 192 h |
| Aluminum material | Acetone | pass | pass | pass | pass |
| | Cyclohexane | pass | pass | pass | pass |
| | Petroleum ether | pass | pass | pass | pass |
| | Xylene | pass | pass | pass | pass |
| | n-propanol | pass | pass | pass | pass |

(4) Acid and alkali test results ("pass" means that no corrosion occurs after experiment for a period of time) are as follows.

| | Acid and alkaline | Time | | | |
|---|---|---|---|---|---|
| Substrate | reagent | 48 h | 96 h | 144 h | 192 h |
| Aluminum material | Acid salt spray | pass | pass | pass | pass |
| | Neutral salt spray | pass | pass | pass | pass |
| | Alkaline salt spray | pass | pass | pass | pass |
| | 5% acetic acid solution | pass | pass | pass | pass |
| | 5% NaOH solution | pass | pass | pass | pass |

High-Insulation Nano-Protective Coating—Embodiments C1-C6

The present invention provides a preparation method for a high insulation nano-protective coating with a modulation structure to solve the above technical problems. In the preparation process, low dipole moment and highly chemically inert organic monomers are filtered out, and the free volume and compactness of the coating are regulated via a polyfunctional monomer, so that the coating has high insulation performance, and excellent protection performance. At the same time, in this preparation process, low-dipole moment organic coating and organosilicon coating preparation or organic fluorocarbon coating preparation are alternately performed to form a low-dipole moment-organosilicon/fluorocarbon modulation multilayer compact structure and composite modulation multilayer structure, which can greatly improve the protective performance of the coating without reducing heat conduction or signal transmission performance.

Because the plasma chemical vapor deposition method is not only applicable to a variety of monomers but also has a strong controllability of the composition and structure of the formed coating. Thus, the composition and structure of the coating can be regulated and constructed by optimizing the design of the monomer and optimization of process parameters so as to form a nano-protective coating with a modulation structure. The interface between layers is utilized to prevent the vertical diffusion of corrosion. At the same time, due to the superlattice effect of the modulation nano-layered structure and the inter-layer dislocation accumulation of the coating is more difficult to be broken and the resistance to underwater electrification has been effectively improved. The coating with a modulation structure has better protection performance and insulation than existing coatings such as parylene with the same thickness. Protection and insulation can be achieved at a lower thickness so as to solves the current problems of using coatings such as parylene, such as too thick thickness, low production efficiency, poor heat dissipation and signal blocking etc. The technical solution adopted by the present invention is as follows:

A preparation method for a high insulation nano-protective coating with a modulation structure, comprising the following steps: (01) a pre-treatment step; (C2) a step of forming a high-insulation coating with a modulation structure; and (C3) a post-treatment step.

(C1) Pre-treatment: A substrate is placed in a reaction chamber of a nano-coating preparation equipment, the reaction chamber is continuously vacuumized, the vacuum degree within the reaction chamber is adjusted to 10 to 200 mTorr, an inert gas He, Ar or a mixture of He and Ar is introduced, and a movement mechanism is turned on so that the substrate moves in the reaction chamber.

(C2) Preparation of high-insulation nano-coating: The following steps are performed for at least once to prepare a high insulation nano-coating with a modulation structure on the surface of the substrate.

Monomer A vapor is introduced into the reaction chamber to achieve a vacuum degree of 30-300 mTorr, plasma discharge is turned on for chemical vapor deposition, and the introduction of monomer A vapor is stopped. Monomer B vapor or monomer C vapor is introduced, and plasma discharge is continued for chemical vapor deposition, and the introduction of monomer B vapor or monomer C vapor is stopped.

The monomer A vapor includes: a mixture of at least one low dipole moment organic monomer and at least one polyfunctional unsaturated hydrocarbon or hydrocarbon derivative, and the mass fraction of the polyfunctional unsaturated hydrocarbon or hydrocarbon derivative in the monomer A vapor is 15-65%.

The monomer B vapor includes: a mixture of at least one monofunctional unsaturated fluorocarbon resin and at least one polyfunctional unsaturated hydrocarbon or hydrocarbon derivative, and the mass fraction of the polyfunctional unsaturated hydrocarbon or hydrocarbon derivative in the monomer B vapor is 15-65%.

The monomer C vapor includes: a mixture of at least one organosilicon monomer containing a double bond, Si—Cl, Si—O—C, Si—N—Si, Si—O—Si structure or an annular structure and at least one polyfunctional unsaturated hydrocarbon or hydrocarbon derivative, and the mass fraction of the polyfunctional unsaturated hydrocarbon or hydrocarbon derivative in the monomer C vapor is 15-65%.

The monomer A vapor, monomer B vapor and monomer C vapor are atomized and volatilized through a feeding pump and is then introduced into the reaction chamber at a low pressure of 10-200 mTorr, and the flow rate of the introduced monomer A vapor, monomer B vapor and monomer C vapor is 10-1000 µL/min.

(C3) Post-treatment: The plasma discharge is stopped, vacuumizing is continued, and the vacuum degree of the reaction chamber is kept as 10-200 mTorr for 1-5 minutes. Air is introduced to the reaction chamber until the pressure thereof reaches an atmospheric pressure. The movement of the substrate is stopped and then the substrate is taken out. Alternatively, the plasma discharge is stopped, the reaction chamber is filled with air or an inert gas to a pressure of 2000-5000 mTorr, and then it is vacuumized to 10-200 mTorr. The above steps of inflating and vacuumizing are performed at least once, air is introduced to the reaction chamber until the pressure thereof reaches an atmospheric pressure, the movement of the substrate is stopped, and then the substrate is taken out.

In a low-vacuum plasma discharge environment, more active free radicals can be formed through effective output of energy to enable chemical bond breaks in monomers with a more active molecular structure, and the free radicals and surface active groups of electronic products initiates polymerization by means of chemical bond bonding to form a nano film, and finally a high insulation nano-coating is formed on the surface of the substrate.

In step (C1), the substrate moves in the reaction chamber, and the substrate movement form is that the substrate reciprocates in a linear or a curve manner relative to the reaction chamber, and the curved movement includes a circular movement, an elliptical movement, a planetary movement, a spherical or other movement in irregularly curved paths.

In step (C1), the substrate is a solid material, and the solid material can be an electronic product, an electrical component, a semi-finished electronic assembly, a PCB board, a metal plate, a polytetrafluoroethylene sheet or an electronic component. Any interface of the surface of the substrate can be exposed to and used in water environment, mold environment, acid and alkaline solvent environment, acid and alkaline salt mist environment, acidic atmospheric environment, organic solvent immersion environment, cosmetics environment, sweat environment, cold and hot cycle impact environment or wet heat alternating environment after the preparation of the organosilicon nano-coating.

In step (C1), the reaction chamber is a rotating chamber or a cubic chamber with a volume of 50-1000 L, the temperature of the reaction chamber is controlled at 30-60° C., and the flow rate of the inert gas is 5-300 SCCM.

In step (C2): monomer A vapor, monomer B vapor or monomer C vapor is introduced, a plasma discharge process is performed for chemical vapor deposition, and the plasma discharge process during the deposition process includes low-power continuous discharge, pulse discharge or periodic alternating discharge.

The plasma discharge process during the deposition process is a low-power continuous discharge, and specifically includes the following deposition processes for at least once.

The deposition process includes a pre-treatment stage and a coating stage. The plasma discharge power in the pre-treatment stage is 150-600 W, and the continuous discharge time is 60-450 s. In the coating stage, and the plasma discharge power is adjusted to 10-150 W and the continuous discharge time is 600-3600 s.

The plasma discharge process during the deposition process is a pulse discharge, and specifically includes the following deposition processes for at least once.

The deposition process includes a pre-treatment stage and a coating stage. The plasma discharge power in the pre-treatment stage is 150-600 W, and the continuous discharge time is 60-450 s. In the coating stage, a pulse discharge is performed, with the power of 10-300 W and time of 600 s to 3600 s. The pulse discharge frequency is 1-1000 HZ, and the duty cycle of the pulse is 1:1-1:500.

The plasma discharge process during the deposition process is a periodic alternating discharge, and specifically includes the following deposition processes for at least once.

The deposition process includes a pre-treatment stage and a coating stage. The plasma discharge power in the pre-treatment stage is 150-600 W, and the continuous discharge time is 60-450 s. During the coating phase, the plasma is periodically alternating discharge output, with the power of 10-300 W, time of 600s to 3600 s and AC frequency of 1-1000 Hz. The waveform of the plasma periodically alternating discharge output is a sawtooth waveform, sine waveform, square wave waveform, full-wave rectified waveform or half-wave rectified waveform.

The low dipole moment organic monomer includes: p-xylene, benzene, toluene, carbon tetrafluoride, α-methylstyrene, poly-p-xylylene, dimethylsiloxane, polydimethylsiloxane with a molecular weight of 500-50,000, allylbenzene, decafluorobiphenyl, decafluorobenzophenone, perfluoroallylbenzene, tetrafluoroethylene, hexafluoropropylene, perfluorooctylamine, iodoperfluorododecane, perfluorotributylamine, 1,8-diiodoperfluorooctane, tridecafluorohexyl iodide, nonafluorobutyl iodide, perfluorodecyl iodide, perfluorooctyl iodide, 1,4-bis(2',3'-epoxypropyl)perfluorobutane, perfluoro-2-methyl-2-pentene, 2-(perfluorobutyl) ethyl methacrylate, 2-(perfluorooctyl) ethyl methacrylate, 2-(perfluorooctyl) iodoethane, perfluorodecyl ethyl iodide, 1,1,2,2-tetrahydroperfluorohexyl iodide, perfluorobutyl ethylene, 1H,1H,2H-Perfluoro-1-decene, 2,4,6-tris(pentadecafluoroheptyl)-1,3,5-triazine, (perfluorohexyl)ethylene, 3-(Perfluoro-n-octyl)propenoxide, perfluorocompound, (perfluorododecyl)ethylene, 1-Iodo-1H,1H,2H,2H-perfluorotetradecane, dibromo-p-xylene, and 1,1,4,4-tetraphenyl-1,3-butadiene.

The monofunctional unsaturated fluorocarbon resin includes: 3-(perfluoro-5-methylhexyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluorooctyl ethyl acrylate, 1H, 1H, 2H, 2H-perfluorooctyl acrylate, 2-(perfluorobutyl) ethyl acrylate, (2H-perfluoropropyl)-2-acrylate, (perfluorocyclohexyl) methacrylate, 3,3,3-trifluoro-1-propyne, 1-ethynyl-3, 5-difluorobenzene, or 4-ethynyltrifluorotoluene.

The organosilicon monomer containing a double bond, Si—Cl, Si—O—C, Si—N—Si, Si—O—Si structure or an annular structure includes:

Organosilicon monomers containing a double bond structure: allyltrimethoxysilane, vinyltriethoxysilane, vinyltrimethylsilane, 3-butenyltrimethylsilane, Vinyltris(methylethylketoxime)silane, tetramethyldivinyldisiloxane, and 1,2,2-trifluorovinyltriphenylsilane.

Organosilicon monomers containing a Si—Cl structure: triphenylchlorosilane, methylvinyldichlorosilane, trichloro(3,3,3-trifluoropropyl)silane, trifluoropropylmethyldichlorosilane, dimethylphenylchlorosilane, tributylchlorosilane, and benzyldimethylchlorosilane.

Organosilicon monomers containing a Si—O—C structure: tetramethoxysilane, trimethoxyhydrosiloxane, n-octyltriethoxysilane, phenyltriethoxysilane, vinyltris(2-methoxythoxy)silane, triethylvinylsilane, hexaethylcyclotrisiloxane, 3-(methacryloyloxy)propyltrimethoxysilane, phenyltris(trimethylsiloxy)silane, diphenyldiethoxysilane, dodecyltrimethoxysilane, n-octyltriethoxysilane, dimethoxysilane, and 3-chloropropyltrimethoxysilane.

Organosilicon monomers containing a Si—N—Si or Si—O—Si structure: hexamethyldisilazane, hexamethylcyclotrisilaneamino, hexamethyldisilazane, and hexamethyl disiloxane.

Organosilicon monomers containing an annular structure: hexamethylcyclotrisiloxane, octamethylcyclotetrasiloxane, hexaphenylcyclotrisiloxane, decamethylcyclopentasiloxane, octaphenylcyclotetra siloxane, triphenylhydroxysilane, diphenyldihydroxysilane, bis(triphenylsilyl) ester, trifluoropropylmethylcyclotrisiloxane, 2,2,4,4-tetramethyl-6,6,8,8-tetraphenylcyclotetrasiloxane, tetramethyltetravinylcyclotetrasiloxane, (3-glycidyloxypropyl) triethoxysilane, and 3-glycidyloxypropyltrimethoxysilane.

The polyfunctional unsaturated hydrocarbons and hydrocarbon derivatives include: 1,3-butadiene, isoprene, 1,4-pentadiene, ethoxylated trimethylolpropane triacrylate, tripropylene glycol diacrylate, polyethylene glycol diacrylate, 1,6-hexanediol diacrylate, ethylene glycol diacrylate, diethylene glycol divinyl ether, or neopentyl glycol diacrylate.

In step (C2), the plasma discharge mode is radio frequency discharge, microwave discharge, intermediate frequency discharge, high frequency discharge, electric spark discharge, and the waveforms of the high frequency discharge and intermediate frequency discharge are sinusoidal or bipolar pulses. RF plasma is a plasma generated by discharge of a high-frequency electromagnetic field. Microwave method uses microwave energy to excite the plasma, which has the advantage of high energy utilization efficiency. At the same time, because of electrodeless discharge, the plasma is pure. It is an excellent method for high-quality, high-speed and large-area preparation.

During the coating preparation process, the movement characteristics of the substrate and the plasma discharge energy are linked. At the time of the plasma discharge during the preparation process, the substrate moves, which improves the coating deposition efficiency and improves the uniformity and compactness of the coating thickness.

The prepared coating is insulative, waterproof and moisture proof, mildew resistant, acid and alkaline solvent resistant, acid and alkaline salt spray resistant, acidic atmosphere resistant, organic solvent immersion resistant, cosmetics resistant, sweat resistant, resistant to cold and heat cycle impact (e.g., −40° C. to +75° C.), resistant to humidity and heat change (e.g., 75%-95% of humidity) and has other characteristics. In addition to the above-mentioned protective properties, in case of a thickness of 1-1000 nm, the effect of the coating on the RF communication signals with frequency of 10M-8 G is less than 5%.

Compared with the prior art, the above technical solution of the present invention has the following advantages:

1. Plasma chemical vapor deposition technology method is more environmentally friendly than the liquid phase conformal coating method. Compared with the parylene evaporative deposition method, the deposition temperature is lower, the speed is faster, the coating structure and composition are strongly controllable, and the monomer selectivity is strong.

2. The substrate moves in the reaction chamber, making the thickness of the substrate coating in different positions tend to be the same, which solves the problem of uneven thickness of the surface coating of the substrate due to the different monomer density in different regions of the reaction chamber. During the preparation process, the movement characteristics of the substrate and the plasma discharge energy are linked. While the discharge energy is output, the substrate moves, which improves the deposition efficiency and significantly improves the compactness of the resulted protective coating. At the same time, due to the increased deposition efficiency, the amount of chemical monomer raw materials used for monomer vapor is only 10%-15% of that used in other existing technologies, thereby reducing emission of exhaust gas. It is more environmentally friendly and is of great significance in improving actual production efficiency.

3. In the present invention, low dipole moment and highly chemically inert organic monomers are filtered out, and the free volume and compactness of the coating are regulated via a polyfunctional monomer, so that the coating has high insulation performance and excellent protection performance.

(1) In the present invention, a benzene ring of high symmetry and a benzene derivative or a perfluorinated compound thereof are selected as monomers. After polymerization, the molecule has low polarity due to symmetry or the fact that each carbon atom is covered by a large number of fluorine atoms. The dielectric constant is very low, less than 2.7, and the insulation is high.

(2) Because the benzene ring structure and fluorocarbon structure have high chemical inertness, the polymers formed by them have excellent chemical stability.

(3) The length and functionality of the molecular chain of the cross-linking agent can effectively improve the compactness and free volume of the coating, thereby improving insulation and protection performance.

(4) By introducing other monomers with cross-linked structure, controlling of the proportion of monomers and giving the equipment corresponding energy output and effective changes in process parameters according to the molecular bond energy, bond length difference and vaporization temperature difference of different monomers, a composite polymer nano-coating with a modulation, composite and graded structure is obtained, such as a high insulation layer-fluorocarbon layer-high insulation layer-fluorocarbon layer-structure coating, which not only ensures the insulation of the film but also improves the environmental corrosion resistance of products such as electronic products and so on.

4. The present invention adopts a method of alternately preparing a low dipole moment organic coating and an organosilicon coating or an organic fluorocarbon coating to form a low-dipole moment-organosilicon/fluorocarbon modulation multilayer compact structure, which can reduce the stress of the coating and improve the toughness of the coating. At the same time, due to the horizontal interface between the low dipole moment and the organosilicon/fluorocarbon, the corrosion will develop laterally when it encounters the horizontal interface during the corrosion process of the coating by the corrosive medium. It is not easy to form longitudinal corrosion that penetrates the coating so as to prevent the corrosive medium from corroding the protected materials and devices through the coating; at the same time, due to the superlattice effect of the modulation nano-layered structure and the inter-layer dislocation accumulation, the coating is more difficult to be broken and the resistance to underwater electrification has been effectively improved.

5. The present invention uses plasma chemical vapor deposition to obtain a nano-protective coating with a modulation structure by controlling the monomer and the coating structure. This coating has the following advantages: each cycle consists of a nano-level low dipole moment and a nano-level organosilicon coating or an organic fluorocarbon coating. The total thickness of the coating can be controlled to 20 nm-10 nm; hardness is controllable to HB-4H; at the same time, it has excellent insulation performance, resistance to underwater electricity and low surface energy and has excellent three-proof performance.

6. Compared with the ordinary single-time long-term coating, the coating obtained by the method of the present invention improves the binding force and compactness of the coating by at least 40%-50% and 35%-50% respectively, and increases the resistance to underwater electricity by 40%-50%. The coating with a modulation structure obtained by alternately periodic alternating discharge has excellent performance and strong practicability.

7. In general, a monofunctional carbon/hydrogen/oxygen organic compound monomer is used for plasma polymerization to obtain a coating with a certain cross-linked structure. The cross-linked structure is formed by the cross-linking of a plurality of active sites formed by chain scission of the monomer during plasma discharge. However, this crosslinked structure is relatively loose, contains more linear components, and has poor resistance to solution penetration and solubility. Compared with traditional monofunctional organic monomers, under plasma conditions, the functional groups connected to silicon in organosilicon monomer can undergo condensation reaction with each other so that a three-dimensional network crosslinking can occur among the monomers so as to further improve the compactness, wear resistance and corrosion resistance of the coating. The hardness of the organosilicon coating of the same thickness is 1-2 grades higher than that of the traditional coating, and the salt spray resistance is increased by 30-50%.

Electronic equipment in daily life is easily damaged by the corrosion of the corrosive environment and is basically in the corrosive environment during the use process. After a long time, it will cause irreparable damage to electronic equipment such as short circuits and open circuits, etc. The coating method of the present invention greatly improves the great significance of nanometer in improving the actual production efficiency. It improves the service life of the coating in corrosive environment and the protection effect of the product. It is mainly used in the following products:

(1) Portable device keyboard: The portable keyboard is small and light, and is often used in computers, mobile phones and other devices. It is convenient for users to work during trip. However, when it encounters contamination of common liquids, such as the accidental overturning of the tea cup, the infiltration of rain and sweat, the keyboard is easily short-circuited and then damaged. After the keyboard is coated with this type of nano-coating, it can ensure that the keyboard surface is easy to clean, and the function is intact after contact with water, so that the keyboard can adapt to more severe environment.

(2) LED display: LED display is used for product promotion, store decoration, lighting, warning and other purposes. Some of its applications are in harsh environment of rain or dust. During rainy days, the outdoor LED advertising screens in shopping malls, road warning lights and LED display control panels in production workshops, etc. are easy to fail, and dust is easy to be accumulated and it is difficult to clean. After application of this nano-coating, the above problems can be effectively solved.

(3) Intelligent fingerprint lock: Fingerprint lock is a smart lock, which integrates computer information technology, electronic technology, mechanical technology and modern hardware technology, and is widely used in the public security criminal investigation and judicial fields. However, its internal circuit is easily short-circuited in case of water, it is difficult to repair and requires violent unlocking. This problem can be avoided after using this coating.

(4) Hearing aids and Bluetooth headsets: There are no communication cables for hearing aids or Bluetooth headsets. After this coating is applied, users can use such products in a water environment for a certain period of time, such as bathing, rainy days, and the devices will not be damaged due to rain water.

(5) Sensors: Some sensors need to work in a liquid environment, such as water pressure and oil pressure sensors, sensors used in underwater operating equipment and sensors that often encounter water in the working environment. These sensors will not fail due to the invading of liquid into the internal structure of the mechanical equipment after this coating is applied.

(6) 3C products: such as mobile phones, notebooks, PSP, etc.

(7) Other equipment that needs to be waterproof: It includes equipment that needs to work in a humid environment, or that may encounter accidents such as common liquid spill, which will affect the normal operation of the internal weak current lines.

The organosilicon nano-coating prepared by this method can also be applied to the following different environments and related products involved:

Waterproof, moisture-proof and mold-proof: such as (1) house interior parts: bathroom ceiling, wallpaper, chandeliers, curtains and window screens; (2) daily necessities: mosquito nets, lampshades, chopstick baskets and car rear-view mirrors; (3) cultural relics and artworks: copybooks, antiques, wood carvings, leather, bronzes, silk, costumes and ancient books; (4) electronic components and electronic products: sensors (operating in wet or dusty environment), chips of various electronic products (electronic blood pressure monitors and smart watches), circuit boards, mobile phones, LED screens and hearing aids; and (5) precision instruments and optical equipment: mechanical watches and microscopes.

Resistance to acid and alkaline solvents, acid and alkaline salt spray and acidic atmosphere: (1) housing interior parts: wallpaper and tiles; (2) protective equipment: acid-resistant (alkali) gloves and acid-resistant (alkali) protective clothing; (3) mechanical equipment and pipelines: flue gas desulfurization equipment, seals (acid/alkaline lubricating oil), pipelines, valves, large-diameter marine transmission pipeline linings, etc.; (4) various reaction kettles and reactors; (5) chemical production and storage; sewage treatment and aeration tanks; and (6) others: acid-alkali workshops, alkali-proof aerospace, energy and power, steel metallurgy, petrochemicals, medical and other industries, storage containers, statues (reducing corrosion of acid rain on them) and sensors (in acid/alkaline environment).

Resistance to organic solvents, cosmetics and sweat: such as (1) paraffins, olefins, alcohols, aldehydes, amines, esters, ethers, ketones, aromatic hydrocarbons, hydrogenated hydrocarbons, terpen hydrocarbons, halogenated hydrocarbons, heterocyclic compounds, solvents containing nitrogen compounds and sulfur compounds; (2) cosmetics packaging container; and (3) fingerprint locks and earphones.

Resistance to cold and heat cycle impact (e.g., −40° C. to +100° C.) and resistance to humidity and heat alternating (e.g., humidity: 75%-95%): electrical, electronic and automotive electrical appliances, such as equipment in the fields of aviation, automotive, home appliances, scientific research and so on.

The present invention is described in detail below with reference to specific embodiments, but the present invention is not limited to the specific embodiments.

Embodiment C1

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 10 mTorr, an inert gas Ar is introduced, and a movement mechanism is turned on so that the substrate moves in the reaction chamber.

In step (1), the substrate is a solid material, and the solid material is a block aluminum material and a PCB board, and any interface of the substrate may be exposed to a humid heat test environment after a cold and heat cycle impact resistance coating is prepared.

In step (1), the reaction chamber is a rotating chamber with a volume 50 L, the temperature of the reaction chamber is controlled at 30° C., and the flow rate of the inert gas is 5 SCCM.

In step (1), the substrate moves in the reaction chamber, and the substrate is moved in a circular manner relative to the reaction chamber at a speed of 10 rpm.

(2) Preparation of high insulation nano-coating: The following steps are performed for 12 times to prepare a high insulation nano-coating with a modulation structure on the surface of the substrate.

Monomer A vapor is introduced into the reaction chamber to achieve a vacuum degree of 40 mTorr, and plasma discharge is turned on for chemical vapor deposition. The introduction of monomer A vapor is stopped, monomer B vapor is introduced, the plasma discharge is continued for chemical vapor deposition, and the introduction of monomer B vapor is stopped.

The monomer A vapor includes: a mixture of one low dipole moment organic monomer and two polyfunctional unsaturated hydrocarbons and hydrocarbon derivatives, and the mass fraction of the polyfunctional unsaturated hydrocarbons or hydrocarbon derivatives in the monomer A vapor is 15%.

The low dipole moment organic monomer is: 1,8-diiodoperfluorooctane,

The two polyfunctional unsaturated hydrocarbons and hydrocarbon derivatives are: 1,3-butadiene, and ethoxylated tri methylolpropane triacrylate.

The monomer B vapor includes: a mixture of one monofunctional unsaturated fluorocarbon resin and three polyfunctional unsaturated hydrocarbons or hydrocarbon derivatives, and the mass fraction of the polyfunctional unsaturated hydrocarbons or hydrocarbon derivatives in the monomer B vapor is 65%.

The one monofunctional unsaturated fluorocarbon resin is: 2-(perfluorododecyl) ethyl acrylate; and the three polyfunctional unsaturated hydrocarbons and hydrocarbon derivatives are: 1,4-pentadiene, tripropylene glycol diacrylate, and 1,6-hexanediol diacrylate.

The monomer A vapor and monomer B vapor are atomized and volatilized through a feeding pump and is then introduced into the reaction chamber at a low pressure of 10 mTorr, and the flow rate of the introduced monomer A vapor and monomer B vapor is 10 μL/min;

In the step (2), monomer A vapor or monomer B vapor is introduced, plasma discharge for chemical vapor deposition, wherein the plasma discharge process during the deposition process is a low-power continuous discharge, and specifically includes the following deposition processes for once.

The deposition process includes a pre-treatment stage and a coating stage. The plasma discharge power in the pre-treatment stage is 150 W, and the continuous discharge time is 450 s. In the coating stage, the plasma discharge power is adjusted to 10 W and the continuous discharge time is 3600 s.

The plasma discharge in step (2) an be a radio frequency discharge.

(3) Post-treatment: The plasma discharge is stopped, vacuumizing is continued, the vacuum degree of the reaction chamber is kept as 10 mTorr for 1 min. Air is introduced to the reaction chamber until the pressure thereof reaches an atmospheric pressure, and then the substrate is taken out.

The dielectric constant of the coating obtained by the above process is 2.73, and the aluminum material and PCB board after coating are subjected to cold and heat cycle impact tests. The results are as follows:

| Test substrate | Experimental conditions | Times of cycle | Experiment time | Result detection |
| --- | --- | --- | --- | --- |
| Aluminum material | −40° C.~+75° C. | 25 | 2 h | Good appearance without affecting performance |
| PCB board | −40° C.~+75° C. | 25 | 2 h | Good appearance without affecting performance |

The results of humid heat alternating tests of the above-mentioned coated aluminum materials are as follows:

| Experimental conditions | Temperature | | 55° C. | | | | |
| --- | --- | --- | --- | --- | --- | --- | --- |
| | Humidity | | 75% | 80% | 85% | 90% | 95% |
| Aluminum material | Time | 12 h | Pass | Pass | Pass | Pass | Pass |
| | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |

Embodiment C2

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 30 mTorr, an inert gas He is introduced, and a movement mechanism is turned on so that the substrate moves; and in step (1), the substrate is a solid material, the solid material is a block aluminum material, and any interface of the substrate after the humid heat-resistant alternating coating is prepared may be exposed to a humid heat test environment.

In step (1), the reaction chamber is a cubic chamber with a volume 270 L, the temperature of the reaction chamber is controlled at 42° C., and the flow rate of the inert gas is 18 SCCM.

In step (1), the substrate is moved to perform a planetary movement at a revolution speed of 4 rpm and a rotation speed of 10 rpm.

(2) Preparation of high insulation nano-coating: The following steps are performed for 1 time to prepare a high insulation nano-coating with a modulation structure on the surface of the substrate.

Monomer A vapor is introduced into the reaction chamber to achieve a vacuum degree of 70 mTorr, and plasma discharge is turned on for chemical vapor deposition. The introduction of monomer A vapor is stopped, monomer C vapor is introduced, and the plasma discharge is continued for chemical vapor deposition. The introduction of monomer C vapor is stopped.

The monomer A vapor includes: a mixture of three low dipole moment organic monomers and one polyfunctional unsaturated hydrocarbon or hydrocarbon derivative, and the mass fraction of the polyfunctional unsaturated hydrocarbon or hydrocarbon derivative in the monomer A vapor is 29%.

The three low dipole moment organic monomers are: polydimethylsiloxane with a molecular weight of 50,000, decafluorobenzophenone, and hexafluoropropylene.

The one polyfunctional unsaturated hydrocarbon or hydrocarbon derivative is ethylene glycol diacrylate.

The monomer C vapor comprises: a mixture of an organosilicon monomer containing a double bond structure and four polyfunctional unsaturated hydrocarbons or hydrocarbon derivatives, and the mass fraction of the polyfunctional unsaturated hydrocarbons or hydrocarbon derivatives in the monomer C vapor is 32%.

The organosilicon monomer containing a double bond structure is: Vinyltris(methylethylketoxime)silane.

The four polyfunctional unsaturated hydrocarbons and hydrocarbon derivatives are: isoprene, 1,4-pentadiene, tripropylene glycol diacrylate, and diethylene glycol divinyl ether.

The monomer A vapor and monomer C vapor are atomized and volatilized through a feeding pump and is then introduced into the reaction chamber at a low pressure of 30 mTorr, and the flow rate of the introduced monomer A vapor and monomer C vapor is 85 μL/min.

In step (2), monomer A vapor or monomer C vapor is introduced, and a plasma discharge process is performed for chemical vapor deposition. The plasma discharge process during the deposition process is a low-power continuous discharge, and specifically includes the following deposition processes for five times.

The deposition process includes a pre-treatment stage and a coating stage. The plasma discharge power in the pre-treatment stage is 600 W, and the continuous discharge time is 60 s. In the coating stage, the plasma discharge power is adjusted to 150 W and the continuous discharge time is 600 s.

The plasma discharge in step (2) can be a microwave discharge.

(3) Post-treatment: The plasma discharge is stopped, vacuumizing is continued, and the vacuum degree of the reaction chamber is kept as 60 mTorr for 2 minutes. Air is introduced to the reaction chamber until the pressure thereof reaches an atmospheric pressure, and then the substrate is taken out.

The dielectric constant of the coating obtained by the above process is 2.45, and the aluminum material after coating is subjected to cold and heat cycle impact tests. The results are as follows:

| Test substrate | Experimental conditions | Times of cycle | Experiment time | Result detection |
|---|---|---|---|---|
| Aluminum substrate | −40° C.~+75° C. | 25 | 2 h | Good appearance without affecting performance |

The results of the humid heat alternating tests of the above-mentioned coated aluminum materials are as follows:

| Experimental conditions | Temperature | | 55° C. | | | | |
|---|---|---|---|---|---|---|---|
| | Humidity | | 75% | 80% | 85% | 90% | 95% |
| Aluminum material | Time | 12 h | Pass | Pass | Pass | Pass | Pass |
| | Time | 24 h | Pass | Pass | Pass | Pass | Pass |
| | Time | 36 h | Pass | Pass | Pass | Pass | Pass |
| | Time | 48 h | Pass | Pass | Pass | Pass | Pass |

Embodiment C3

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 80 mTorr, a mixture of inert gas Ar and He is introduced, and a movement mechanism is turned on so that the substrate moves.

In step (1), the substrate is a solid material, and the solid material can be a block of polytetrafluoroethylene plate and an electrical component. Any interface of the block polytetrafluoroethylene plate can be exposed to and used in the GJB150.10A-2009 mold test environment after a moldproof coating is prepared on the surface. Any interface of the electrical component can be exposed to and used in the environment described in the international industrial waterproof grade standard IPX7 after a waterproof and electrical breakdown resistant coating is prepared on the surface.

In step (1), the reaction chamber is a rotating chamber with a volume 580 L, the temperature of the reaction chamber is controlled at 53° C., and the flow rate of the inert gas is 65 SCCM.

In step (1), the substrate performs circle movement at a speed of 12 rpm.

(2) Preparation of high-insulation nano-coating: The following steps are performed for 8 times to prepare a high-insulation nano-coating with a modulation structure on the surface of the substrate.

Monomer A vapor is introduced into the reaction chamber to achieve a vacuum degree of 120 mTorr, and plasma discharge is turned on for chemical vapor deposition. Introduction of monomer A vapor is stopped, monomer C vapor is introduced, and the plasma discharge is continued for chemical vapor deposition. The introduction of monomer C vapor is stopped.

The monomer A vapor comprises: a mixture of four low dipole moment organic monomers and two polyfunctional unsaturated hydrocarbons and hydrocarbon derivatives, and the mass fraction of the polyfunctional unsaturated hydrocarbons or hydrocarbon derivatives in the monomer A vapor is 48%.

The four low-dipole moment organic monomers are: toluene, α-methylstyrene, dimethylsiloxane and decafluorobenzophenone. The two multifunctional unsaturated hydrocarbons and hydrocarbon derivatives are: isoprene and neopentyl glycol diacrylate.

The monomer C vapor comprises: a mixture of five organosilicon monomers containing a Si—Cl structure and two polyfunctional unsaturated hydrocarbons or hydrocarbon derivatives, and the mass fraction of the polyfunctional unsaturated hydrocarbons or hydrocarbon derivatives in the monomer C vapor is 52%.

The five organosilicon monomers containing a Si—Cl structure are: triphenylchlorosilane, trifluoropropylmethyldichlorosilane, dimethylphenylchlorosilane, tributylchlorosilane, and benzyldimethylchlorosilane;

The two polyfunctional unsaturated hydrocarbons and hydrocarbon derivatives are: polyethylene glycol diacrylate and 1,6-hexanediol diacrylate.

The monomer A vapor and monomer C vapor are atomized and volatilized through a feeding pump and is then introduced into the reaction chamber at a low pressure of 80 mTorr, and the flow rate of the introduced monomer A vapor and monomer C vapor is 440 μL/min.

In step (2), monomer A vapor or monomer C vapor is introduced, and a plasma discharge process is performed for chemical vapor deposition. The plasma discharge process during the deposition process is a pulse discharge, and specifically includes the following deposition processes for once.

The deposition process includes a pre-treatment stage and a coating stage. The plasma discharge power in the pre-treatment stage is 150 W, and the continuous discharge time is 450 s. In the coating stage, a pulse discharge is performed, with the power of 10 W and time of 3600 s, the pulse discharge frequency is 1 HZ, and the duty cycle of the pulse is 1:500.

The plasma discharge mode in step (2) can be an electric spark discharge.

(3) Post-treatment: The plasma discharge is stopped, vacuumizing is continued, and the vacuum degree of the reaction chamber is kept to 100 mTorr for 3 minutes. Then air is introduced to the reaction chamber until the pressure thereof reaches an atmospheric pressure, and then the substrate is taken out.

The dielectric constant of the coating obtained by the above process is 2.46, and the PTFE board after coating is subjected to GJB150.10A-2009 mold tests. The results are as follows:

| PTFE board-performance test | |
|---|---|
| Water contact angle | 121° |
| Oil contact angle | 95. |
| Mold resistance grade | Grade 2 |
| Degree of surface mold spots | 6% |

Test results of underwater immersion tests for the prepared electrical component with the prepared waterproof and electrical breakdown resistant coating under different voltages are as follows:

| Resistance to underwater electricity | | | |
|---|---|---|---|
| | Time to reach 1 mA at a certain voltage | | |
| | 3.8 V | 5 V | 12.5 V |
| Embodiment C3 | >96 h | >96 h | >96 h |

IPX7 waterproof rating test results (1 meter underwater immersion test for 30 minutes) are as follows:

| IPX7 waterproof grade test | |
|---|---|
| Embodiment C3 | Electrical components work properly. |

Embodiment C4

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 100 mTorr, an inert gas Ar is introduced, and a movement mechanism is turned on so that the substrate moves.

In step (1), the substrate is a solid material, and the solid material can be a block polytetrafluoroethylene plate and an electrical component. Any interface of the block polytetrafluoroethylene plate can be exposed to and used in the GJB150.10A-2009 mold test environment after a mold-proof coating is prepared on the surface. Any interface of the electrical component can be exposed to and used in the environment described in the international industrial waterproof grade standard IPX7 after a waterproof and electrical breakdown resistant coating is prepared on the surface.

In step (1), the volume of the reaction chamber is 640 L, the temperature of the reaction chamber is controlled at 54° C., and the flow rate of the inert gas is 240 SCCM.

In step (1), the substrate is moved to linearly reciprocate at a movement speed of 23 mm/min.

(2) Preparation of high insulation nano-coating: The following steps are performed for 15 times to prepare a high insulation nano-coating with a modulation structure on the surface of the substrate.

Monomer A vapor is introduced into the reaction chamber to achieve a vacuum degree of 150 mTorr, and plasma discharge is turned on for chemical vapor deposition. Introduction of monomer A vapor is stopped, monomer B vapor is introduced, and the plasma discharge is continued for chemical vapor deposition, and the introduction of monomer B vapor is stopped.

The monomer A vapor comprises: a mixture of five low dipole moment organic monomers and three polyfunctional unsaturated hydrocarbons or hydrocarbon derivatives, and the mass fraction of the polyfunctional unsaturated hydrocarbons or hydrocarbon derivatives in the monomer A vapor is 65%.

The five low-dipole moment organic monomers are: p-xylene, 1H, 1H-perfluorooctylamine, 2-(perfluorooctyl) ethyl methacrylate, 1,1,2,2-tetrahydroperfluorohexyl iodide, and 2,4,6-tris(pentadecafluoroheptyl)-1,3,5-triazine.

The three polyfunctional unsaturated hydrocarbons and hydrocarbon derivatives are: isoprene, tripropylene glycol diacrylate, and polyethylene glycol diacrylate;

The monomer B vapor comprises: a mixture of four monofunctional unsaturated fluorocarbon resins and four polyfunctional unsaturated hydrocarbons or hydrocarbon derivatives, and the mass fraction of the polyfunctional unsaturated hydrocarbons or hydrocarbon derivative in the monomer B vapor is 15%.

The four monofunctional unsaturated fluorocarbon resins are: 2-(perfluorobutyl) ethyl acrylate, (perfluorocyclohexyl) methacrylate, 3,3,3-trifluoro-1-propyne, and 4-ethynyltrifluorotoluene.

The four polyfunctional unsaturated hydrocarbons and hydrocarbon derivatives are: isoprene, 1,4-pentadiene, polyethylene glycol diacrylate, and 1,6-hexanediol diacrylate.

The monomer A vapor and monomer B vapor are atomized and volatilized through a feeding pump and then introduced into the reaction chamber at a low pressure of 100 mTorr, and the flow rate of the introduced monomer A vapor and monomer B vapor is 1000 μL/min.

In step (2), monomer A vapor or monomer B vapor is introduced, a plasma discharge process is performed for chemical vapor deposition. The plasma discharge process during the deposition process is a pulse discharge, and specifically includes the following deposition processes for seven times.

The deposition process includes a pre-treatment stage and a coating stage. The plasma discharge power in the pre-treatment stage is 600 W, and the continuous discharge time is 60 s. In the coating stage, a pulse discharge is performed, with the power of 300 W and time of 600 s. The pulse discharge frequency is 1000 HZ, and the duty cycle of the pulse is 1:1.

The plasma discharge in step (2) can be a high-frequency discharge, and the waveform of the high-frequency discharge is sinusoidal.

(3) Post-treatment: The monomer vapor is stopped being introduced, the plasma discharge is stopped at the same time, vacuumizing is continued, and the vacuum degree of the reaction chamber is kept to 200 mTorr for 4 minutes. Then air is introduced to the reaction chamber until the pressure thereof reaches an atmospheric pressure, and then the substrate is taken out.

The dielectric constant of the coating obtained by the above process is 2.48, and the PTFE board after coating is subjected to GJB150.10A-2009 mold tests. The results are as follows.

| PTFE board-performance test | |
|---|---|
| Water contact angle | 126° |
| Oil contact angle | 98° |

| PTFE board-performance test | |
|---|---|
| Mold resistance grade | Grade 2 |
| Degree of surface mold spots | 7% |

Test results of underwater immersion tests for the prepared electrical component with the prepared waterproof and electrical breakdown resistant coating under different voltages are as follows:

| Resistance to underwater electricity | | | |
|---|---|---|---|
| | Time to reach 1 mA at a certain voltage | | |
| | 3.8 V | 5 V | 12.5 V |
| Embodiment C4 | >96 h | >96 h | >96 h |

Results of IPX7 waterproof rating tests (1 meter underwater immersion test for 30 minutes) are as follows:

| IPX7 waterproof grade test | |
|---|---|
| Embodiment C4 | Electrical components work properly. |

Embodiment C5

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 200 mTorr, a mixture of inert gas Ar and He is introduced, and a movement mechanism is turned on so that the substrate moves.

In step (1), the substrate is a solid material, and the solid material can be a block aluminum material. Any interface of the substrate may be exposed to an acid and alkaline test environment after an acid and alkaline resistant coating is prepared.

In step (1), the volume of the reaction chamber is 1000 L, the temperature of the reaction chamber is controlled at 60° C., and the flow rate of the inert gas is 300 SCCM.

In step (1), the substrate is moved to reciprocate in a curve manner at a speed of 50 mm/min.

(2) Preparation of high insulation nano-coating: The following steps are performed for 26 times to prepare a high insulation nano-coating with a modulation structure on the surface of the substrate.

Monomer A vapor is introduced into the reaction chamber to achieve a vacuum degree of 300 mTorr, and plasma discharge is turned on for chemical vapor deposition. Introduction of monomer A vapor is stopped, monomer C vapor is introduced, and the plasma discharge is continued for chemical vapor deposition. The introduction of monomer C vapor is stopped.

The monomer A vapor comprises: a mixture of six low dipole moment organic monomers and three polyfunctional unsaturated hydrocarbons and hydrocarbon derivatives, and the mass fraction of the polyfunctional unsaturated hydrocarbons or hydrocarbon derivatives in the monomer A vapor is 56%.

The six low-dipole moment organic monomers are: benzene, α-methylstyrene, dimethylsiloxane, allylbenzene, 2-(perfluorobutyl) ethyl methacrylate, and 1,1,2,2-tetrahydroperfluorohexyl iodide.

The three polyfunctional unsaturated hydrocarbons and hydrocarbon derivatives are: 1,4-pentadiene, polyethylene glycol diacrylate, and 1,6-hexanediol diacrylate;

The monomer C vapor comprises: a mixture of four organosilicon monomers containing a Si—O—C structure and three polyfunctional unsaturated hydrocarbons or hydrocarbon derivatives, and the mass fraction of the polyfunctional unsaturated hydrocarbons or hydrocarbon derivatives in the monomer C vapor is 65%.

The four organosilicon monomers containing a Si—O—C structure are: trimethoxyhydrosiloxane, n-octyltriethoxysilane, triethylvinylsilane, and 3-(methacryloyloxy)propyltrimethoxysilane.

The three polyfunctional unsaturated hydrocarbons and hydrocarbon derivatives are: 1,4-pentadiene, ethoxylated trimethylolpropane triacrylate, and polyethylene glycol diacrylate.

The monomer A vapor and monomer C vapor are atomized and volatilized through a feeding pump and is then introduced into the reaction chamber at a low pressure of 200 mTorr, and the flow rate of the introduced monomer A vapor and monomer C vapor is 780 μL/min.

In step (2), monomer A vapor or monomer C vapor is introduced, plasma discharge for chemical vapor deposition, and the plasma discharge process during the deposition process is periodic alternating discharge, and specifically includes the following deposition processes for once.

The deposition process includes a pre-treatment stage and a coating stage. The plasma discharge power in the pre-treatment stage is 150 W, and the continuous discharge time is 450 s. During the coating phase, the plasma is periodically alternating discharge output, with the power of 10 W, time of 3600 s and AC frequency of 1 Hz. The waveform of the plasma periodically alternating discharge output is a sawtooth waveform.

The plasma discharge in step (2) can be intermediate-frequency discharge, and the waveform of the intermediate-frequency discharge is a bipolar pulse.

(3) Post-treatment: The plasma discharge is stopped, the reaction chamber is filled with air to a pressure of 2000 mTorr, and then it is vacuumized to 10 mTorr. The above steps of inflating and vacuumizing are performed for ten times. Air is introduced to the reaction chamber until the pressure thereof reaches an atmospheric pressure. The movement of the substrate is stopped, and then the substrate is taken out. The coating obtained by the above process and the coated aluminum material is tested, and the test results are as follows:

| | Performance | | | |
|---|---|---|---|---|
| | Water contact angle | Oil contact angle | Adhesion | Dielectric constant |
| Embodiment C5 | 125° | 84° | Low adhesion and water droplets are easy to slide. | 2.57 |

Test results of resistance to organic solvents ("pass" means that the contact angle change is less than 5° after immersion for a period of time) are as follows.

| | Chemical | Time | | | |
|---|---|---|---|---|---|
| Substrate | reagent | 48 h | 96 h | 144 h | 192 h |
| Aluminum sheet | Acetone | pass | pass | pass | pass |
| | Cyclohexane | pass | pass | pass | pass |
| | Petroleum ether | pass | pass | pass | pass |
| | Xylene | pass | pass | pass | pass |
| | n-propanol | pass | pass | pass | pass |

Acid and alkali test results ("pass" means that no corrosion occurs after experiment for a period of time) are as follows.

| | Acid and alkaline | Time | | | |
|---|---|---|---|---|---|
| Substrate | reagent | 48 h | 96 h | 144 h | 192 h |
| Aluminum sheet | Acid salt spray | pass | pass | pass | pass |
| | Neutral salt spray | pass | pass | pass | pass |
| | Alkaline salt spray | pass | pass | pass | pass |
| | 5% acetic acid solution | pass | pass | pass | pass |
| | 5% NaOH solution | pass | pass | pass | pass |

Embodiment C6

A preparation method for a high insulation nano-protective coating with a modulation structure, comprising the following steps: (1) a pre-treatment step; (2) a step of forming a high-insulation coating with a modulation structure; and (3) a post-treatment step.

(1) Pre-treatment: A substrate is placed in a reaction chamber of a nano-coating preparation equipment, the reaction chamber is closed and continuously vacuumized, the vacuum degree within the reaction chamber is adjusted to 160 mTorr, an inert gas Ar is introduced, and a movement mechanism is turned on so that the substrate moves.

In step (1), the substrate is a solid material, and the solid material can be a block aluminum material and an electrical component. Any interface of the substrate may be exposed to an organic solvent test environment after a high insulation coating is prepared on its surface.

In step (1), the volume of the reaction chamber is 400 L, the temperature of the reaction chamber is controlled at 40° C., and the flow rate of the inert gas is 150 SCCM.

In step (1), the substrate is moved to reciprocate in a curve manner at a speed of 30 mm/min.

(2) Preparation of high-insulation nano-coating: The following steps are performed for 35 times to prepare a high insulation nano-coating with a modulation structure on the surface of the substrate.

Monomer A vapor is introduced into the reaction chamber to achieve a vacuum degree of 230 mTorr, and plasma discharge is turned on for chemical vapor deposition. The introduction of monomer A vapor is stopped, monomer C vapor is introduced, and the plasma discharge is continued for chemical vapor deposition, and the introduction of monomer C vapor is stopped.

The monomer A vapor comprises: a mixture of five low dipole moment organic monomers and four polyfunctional unsaturated hydrocarbons or hydrocarbon derivatives, and the mass fraction of the polyfunctional unsaturated hydrocarbon or hydrocarbon derivative in the monomer A vapor is 65%.

The five low-dipole moment organic monomers are: allylbenzene, decafluorobenzophenone, hexafluoropropylene, 1H, 1H-perfluorooctylamine, and perfluorooctyl iodide.

The four polyfunctional unsaturated hydrocarbons and hydrocarbon derivatives are: 1,4-pentadiene, ethoxylated trimethylolpropane triacrylate, polyethylene glycol diacrylate, and 1,6-hexanediol diacrylate.

The monomer C vapor comprises: a mixture of six organosilicon monomers containing an annular structure and four polyfunctional unsaturated hydrocarbons or hydrocarbon derivatives, and the mass fraction of the polyfunctional unsaturated hydrocarbons or hydrocarbon derivatives in the monomer C vapor is 40%.

The six organosilicon monomers containing an annular structure are: hexaphenylcyclotrisiloxane, octaphenylcyclotetra siloxane, diphenyldihydroxysilane, bis(triphenylsilyl) ester, trifluoropropylmethylcyclotrisiloxane, and 2,2,4,4-tetramethyl-6,6,8,8-tetraphenylcyclotetrasiloxane.

The four polyfunctional unsaturated hydrocarbons and hydrocarbon derivatives are: 1,3-butadiene, isoprene, ethoxylated trimethylolpropane triacrylate, and ethylene glycol diacrylate.

The monomer A vapor and monomer C vapor are atomized and volatilized through a feeding pump and then introduced into the reaction chamber at a low pressure of 160 mTorr, and the flow rate of the introduced monomer A vapor and monomer C vapor is 460 µL/min.

In step (2), monomer A vapor or monomer C vapor is introduced, a plasma discharge process is performed for chemical vapor deposition. The plasma discharge process during the deposition process is periodic alternating discharge, and specifically includes the following deposition processes for five times.

The deposition process includes a pre-treatment stage and a coating stage. The plasma discharge power in the pre-treatment stage is 600 W, and the continuous discharge time is 60 s. During the coating phase, the plasma is periodically alternating discharge output, with the power of 300 W, time of 600 s and AC frequency of 1000 Hz. The waveform of the plasma periodically alternating discharge output is a half-wave rectified waveform.

The plasma discharge in step (2) can be a microwave discharge.

(3) Post-treatment: The plasma discharge is stopped, the reaction chamber is filled with an inert gas to a pressure of 5000 mTorr, and then it is vacuumized to 200 mTorr. The above steps of inflating and vacuumizing are performed once. Air is introduced to the reaction chamber until the pressure thereof reaches an atmospheric pressure. The movement of the substrate is stopped, and then the substrate is taken out.

The test effects of the above-mentioned coated aluminum materials are as follows.

(1) Hydrophobicity and oleophobicity

| | Performance | | | |
|---|---|---|---|---|
| | Water contact angle | Oil contact angle | Adhesion | Dielectric constant |
| Embodiment C6 | 120° | 80° | Low adhesion and water droplets are easy to slide. | 2.46 |

(2) The results of the underwater immersion test of the coated electrical components under different voltages are as follows.

| | Resistance to underwater electricity | | |
|---|---|---|---|
| | Time to reach 1 mA at a certain voltage | | |
| | 3.8 V | 5 V | 12.5 V |
| Embodiment C6 | >120 h | >120 h | >120 h |

(3) Test results of resistance to organic solvents ("pass" means that the contact angle change is less than 5° after immersion for a period of time) are follows.

| Substrate | Chemical reagent | Time | | | |
|---|---|---|---|---|---|
| | | 48 h | 96 h | 144 h | 192 h |
| Aluminum material | Acetone | pass | pass | pass | pass |
| | Cyclohexane | pass | pass | pass | pass |
| | Petroleum ether | pass | pass | pass | pass |
| | Xylene | pass | pass | pass | pass |
| | n-propanol | pass | pass | pass | pass |

(4) Acid and alkali test results ("pass" means that no corrosion occurs after experiment for a period of time) are as follows.

| Substrate | Acid and alkaline reagent | Time | | | |
|---|---|---|---|---|---|
| | | 48 h | 96 h | 144 h | 192 h |
| Aluminum material | Acid salt spray | pass | pass | pass | pass |
| | Neutral salt spray | pass | pass | pass | pass |
| | Alkaline salt spray | pass | pass | pass | pass |
| | 5% acetic acid solution | pass | pass | pass | pass |
| | 5% NaOH solution | pass | pass | pass | pass |

FIG. 1 is a flowchart of a method 100 in accordance with an embodiment of the present invention. The method 100 is for generating an organosilicon nano-protective coating. At block 101, the method 100 starts by placing a substrate in a reaction chamber of a nano-coating preparation equipment. In some embodiments, the reaction chamber can be continuously vacuumized. In some embodiments, a vacuum degree in the reaction chamber is 10 to 200 mTorr. At block 103, the method 100 continues to introduce an inert gas. In some embodiments, the inert gas includes helium (He) and/or argon (Ar)

At block 105, the method 100 continues by turning on a movement mechanism so that the substrate is moved in the reaction chamber. In some embodiments, the movement mechanism can be a carrier, an arm, a holder, etc. In some embodiments, the substrate is moved in a linear manner or a curved manner (e.g., a circular movement, an elliptical movement, a planetary movement, or a spherical movement).

At block 107, the method 100 continues by introducing a first monomer (e.g., a first monomer vapor or "monomer A") into the reaction chamber. In some embodiments, the monomer vapor can be introduced into the reaction chamber to achieve a vacuum degree of 30-300 mTorr. In some embodiments, the first monomer vapor can include a mixture of (i) at least one monofunctional unsaturated fluorocarbon resin and (ii) at least one polyfunctional unsaturated hydrocarbon or hydrocarbon derivative. In some embodiments, the mass fraction of the polyfunctional unsaturated hydrocarbon or hydrocarbon derivative in the monomer vapor can be 15-65%. In some embodiments, the flow rate of the monomer vapor is 10-1000 μL/min.

At block 109, the method 100 continues by turning on a plasma discharge for chemical vapor deposition. At block 111, a second monomer (e.g., a second monomer vapor or "monomer B") into the reaction chamber. In some embodiments, the second monomer can be introduced into the reaction chamber to achieve a vacuum degree of 30-300 mTorr. In some embodiments, the second monomer can include a mixture of (i) at least one organosilicon monomer containing a double bond, Si—Cl, Si—O—C, Si—N—Si, Si—O—Si structure or an annular structure and (ii) at least one polyfunctional unsaturated hydrocarbon or hydrocarbon derivative. In some embodiments, the mass fraction of the polyfunctional unsaturated hydrocarbon or hydrocarbon derivative in the monomer vapor can be 15-65%. In some embodiments, the flow rate of the monomer vapor is 10-1000 μL/min.

In some embodiments, the second can include at least one monofunctional unsaturated fluorocarbon resin and at least one polyfunctional unsaturated hydrocarbon or hydrocarbon derivative.

At block 113, the method 100 continues by forming an organosilicon nano-coating on a surface of the substrate by the chemical vapor deposition. In some embodiments, the organosilicon nano-coating can be formed in two stages, a pre-treatment stage and a coating stage. In the pre-treatment stage, the plasma discharge power can be set as 150-600 W for a continuous discharge time 60-450 s. In the coating stage, the plasma discharge power can be adjusted to 10-150 W for 600-3600 s.

In some embodiments, the plasma discharge includes a periodic alternating discharge. The periodic alternating discharge can correspond to a waveform. The waveform can include at least one of a sawtooth waveform, a sine waveform, or a square wave waveform.

In some embodiments, the method 100 can include introducing oxygen and/or water vapor at a flow rate of 10-100 μL/min so as to harden the organosilicon nano-coating.

In some embodiments, the method can be used to generate a high-insulation nano-protective coating. In such embodiments, the monomer vapor can include at least one low dipole moment organic monomer and at least one polyfunctional unsaturated hydrocarbon or hydrocarbon derivative.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

The invention claimed is:

1. A method for generating a nano-protective coating, comprising:
    placing a substrate in a reaction chamber of a nano-coating preparation equipment, wherein the reaction chamber is continuously vacuumized, and wherein a vacuum degree in the reaction chamber is 10 to 200 mTorr;
    introducing an inert gas, wherein the inert gas includes helium (He) and/or argon (Ar);
    turning on a movement mechanism so that the substrate is moved in the reaction chamber;
    introducing a first monomer into the reaction chamber to achieve a vacuum degree of 30-300 mTorr;
    turning on a plasma discharge for a chemical vapor deposition;
    stopping introducing the first monomer;
    introducing a second monomer into the reaction chamber; and
    forming an organosilicon nano-coating on a surface of the substrate by the chemical vapor deposition;
    wherein the first monomer includes a mixture of at least one monofunctional unsaturated fluorocarbon resin and at least one first polyfunctional unsaturated hydrocarbon;
    wherein the second monomer includes a mixture of at least one organosilicon monomer containing a double bond, Si—Cl, Si—O—C, Si—N—Si, Si—O—Si structure or an annular structure and at least one second polyfunctional unsaturated hydrocarbon;
    wherein a mass fraction of the first or second polyfunctional unsaturated hydrocarbon or hydrocarbon derivative in monomer vapor formed by the first monomer and the second monomer is 15-65%; and
    wherein a flow rate of the monomer vapor is 10-1000 μL/min.

2. The method of claim 1, wherein the organosilicon nano-coating includes multiple individual coatings, and wherein each individual coating includes a nano-level organosilicon coating and a nano-level organic fluorocarbon coating.

3. The method of claim 1, wherein the organosilicon nano-coating has a thickness of 20 nm-10 μm.

4. The method of claim 1, wherein the organosilicon nano-coating has a hardness of HB-4H.

5. The method of claim 1, further comprising:
    turning off the plasma discharge;
    continuing to maintain a vacuum degree of the reaction chamber to 10-200 mTorr for at least one minute;
    introducing air to the reaction chamber until a pressure of the reaction chamber equals to an atmospheric pressure;
    turning off the movement mechanism such that the substrate is stopped; and
    removing the substrate from the reaction chamber.

6. The method of claim 1, wherein the substrate is moved in a linear manner.

7. The method of claim 1, wherein the substrate is moved in a curved manner.

8. The method of claim 7, wherein the curved manner corresponds to a circular movement, an elliptical movement, a planetary movement, or a spherical movement.

9. The method of claim 1, wherein the substrate includes a solid material including an electronic product, an electrical component, a semi-finished electronic assembly, a printed circuit board (PCB), a metal plate, or a polytetrafluoroethylene sheet.

10. The method of claim 1, wherein the reaction chamber includes a rotating chamber or a cubic chamber with a volume of 50-1000 L, and wherein a temperature of the reaction chamber is controlled at 30-60° C., and wherein a flow rate of the inert gas is 5-300 SCCM.

11. The method of claim 1, further comprising:
    forming the organosilicon nano-coating on the surface of the substrate in a pre-treatment stage and a coating stage, wherein, in the pre-treatment stage, a plasma discharge power is 150-600 W and a continuous discharge time is 60-450 s, and wherein, in the coating stage, the plasma discharge power is adjusted to 10-150 W and the continuous discharge time is 600-3600 s.

12. The method of claim 1, wherein the plasma discharge includes a periodic alternating discharge, and wherein the periodic alternating discharge corresponds to a waveform, and wherein the waveform includes at least one of a sawtooth waveform, a sine waveform, or a square wave waveform.

13. The method of claim 1, wherein the monofunctional unsaturated fluorocarbon resin includes at least one of: 3-(perfluoro-5-methylhexyl)-2-hydroxypropyl methacrylate, 2-(perfluorodecyl) ethyl methacrylate, 2-(perfluorohexyl) ethyl methacrylate, 2-(perfluorododecyl) ethyl acrylate, 2-perfluorooctyl ethyl acrylate, 1H, 1H, 2H, 2H-perfluorooctyl acrylate, 2-(perfluorobutyl) ethyl acrylate, (2H-perfluoropropyl)-2-acrylate, (perfluorocyclohexyl) methacrylate, 3,3,3-trifluoro-1-propyne, 1-ethynyl-3, 5-difluorobenzene or 4-ethynyltrifluorotoluene.

14. The method of claim 1, wherein the organosilicon monomer includes at least one of: triphenylchlorosilane, methylvinyldichlorosilane, trichloro (3,3,3-trifluoropropyl) silane, trifluoropropylmethyldichlorosilane, dimethylphenylchlorosilane, tributylchlorosilane, or benzyldimethylchlorosilane.

15. The method of claim 1, wherein the organosilicon monomer includes at least one of: tetramethoxysilane, trimethoxyhydrosiloxane, n-octyltriethoxysilane, phenyltriethoxysilane, vinyltris (2-methoxythoxy)silane, triethylvinylsilane, hexaethylcyclotrisiloxane, 3-(methacryloyloxy) propyltrimethoxysilane, phenyltris(trimethylsiloxy)silane, diphenyldiethoxysilane, dodecyltrimethoxysilane, n-octyltriethoxysilane, dimethoxysilane, or 3-chloropropyltrimethoxysilane.

16. The method of claim 1, wherein the organosilicon monomer includes at least one of: hexamethyldisilazane, hexamethylcyclotrisilaneamino, hexamethyldisilazane, or hexamethyl disiloxane.

17. The method of claim 1, wherein the organosilicon monomer includes at least one of: thylcyclotrisiloxane, octamethylcyclotetrasiloxane, hexaphenylcyclotrisiloxane, decamethylcyclopentasiloxane, octaphenylcyclotetra siloxane, triphenylhydroxysilane, diphenyldihydroxysilane, bis (triphenylsilyl) ester, trifluoropropylmethylcyclotrisiloxane,2,4,4-tetramethyl-6,6,8,8-tetraphenylcyclotetrasiloxane, tetramethyltetravinylcyclotetrasiloxane, (3-glycidyloxypropyl) triethoxysilane, and 3-glycidyloxypropyltrimethoxysilane.

18. The method of claim 1, further comprising introducing oxygen at a flow rate of 10-100 μL/min so as to harden the organosilicon nano-coating.

19. The method of claim 1, further comprising introducing water vapor at a flow rate of 10-100 μL/min so as to harden the organosilicon nano-coating.

20. A method for generating a nano-protective coating, comprising:
placing a substrate in a reaction chamber of a nano-coating preparation equipment, wherein the reaction chamber is continuously vacuumized, and wherein a vacuum degree in the reaction chamber is 10 to 200 mTorr;
introducing an inert gas, wherein the inert gas includes helium (He) and/or argon (Ar);
turning on a movement mechanism so that the substrate is moved in the reaction chamber;
introducing a first monomer into the reaction chamber to achieve a vacuum degree of 30-300 mTorr;
turning on a plasma discharge for a chemical vapor deposition;
stopping introducing the first monomer;
introducing a second monomer into the reaction chamber; and
forming an organosilicon nano-coating on a surface of the substrate by the chemical vapor deposition;
wherein the second monomer includes a mixture of at least one monofunctional unsaturated fluorocarbon resin and at least one first polyfunctional unsaturated hydrocarbon or hydrocarbon derivative;
wherein the first monomer includes a mixture of at least one organosilicon monomer containing a double bond, Si—Cl, Si—O—C, Si—N—Si, Si—O—Si structure or an annular structure and at least one second polyfunctional unsaturated hydrocarbon or hydrocarbon derivative;
wherein a mass fraction of the first or second polyfunctional unsaturated hydrocarbon in monomer vapor formed by the first monomer and the second monomer is 15-65%; and
wherein a flow rate of the monomer vapor is 10-1000 μL/min.

21. The method of claim 20, further comprising introducing oxygen at a flow rate of 10-100 μL/min so as to harden the organosilicon nano-coating.

22. The method of claim 20, further comprising introducing water vapor at a flow rate of 10-100 μL/min so as to harden the organosilicon nano-coating.

23. A method for generating a nano-protective coating, comprising:
placing a substrate in a reaction chamber of a nano-coating preparation equipment, wherein the reaction chamber is continuously vacuumized, and wherein a vacuum degree in the reaction chamber is 10 to 200 mTorr;
introducing an inert gas, wherein the inert gas includes helium (He) and/or argon (Ar);
turning on a movement mechanism so that the substrate is moved in the reaction chamber;
introducing a first monomer into the reaction chamber to achieve a vacuum degree of 30-300 mTorr;
turning on a plasma discharge for chemical vapor deposition;
stopping introducing the first monomer;
introducing a second monomer into the reaction chamber;
forming an organosilicon nano-coating on a surface of the substrate by the chemical vapor deposition;
wherein the first monomer includes at least one dipole moment organic monomer and at least one polyfunctional unsaturated hydrocarbon;
wherein a mass fraction of the polyfunctional unsaturated hydrocarbon in the monomer vapor formed by the first monomer and the second monomer is 15-65%; and
wherein a flow rate of the monomer vapor is 10-1000 μL/min.

24. The method of claim 23, wherein the second monomer includes at least one monofunctional unsaturated fluorocarbon resin and at least one polyfunctional unsaturated hydrocarbon or hydrocarbon derivative.

25. The method of claim 23, wherein the second monomer includes a double bond, Si—Cl, Si—O—C, Si—N—Si, Si—O—Si structure or an annular structure and at least one polyfunctional unsaturated hydrocarbon or hydrocarbon derivative.

26. The method of claim 23, further comprising introducing oxygen at a flow rate of 10-100 μL/min so as to harden the organosilicon nano-coating.

27. The method of claim 23, further comprising introducing water vapor at a flow rate of 10-100 μL/min so as to harden the organosilicon nano-coating.

* * * * *